US008833430B2

(12) United States Patent
Aizenberg et al.

(10) Patent No.: US 8,833,430 B2
(45) Date of Patent: Sep. 16, 2014

(54) VERSATILE HIGH ASPECT RATIO ACTUATABLE NANOSTRUCTURED MATERIALS THROUGH REPLICATION

(75) Inventors: Joanna Aizenberg, Boston, MA (US); Boaz Pokroy, Boston, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 321 days.

(21) Appl. No.: 13/001,490

(22) PCT Filed: Jun. 26, 2009

(86) PCT No.: PCT/US2009/048880
§ 371 (c)(1),
(2), (4) Date: Apr. 28, 2011

(87) PCT Pub. No.: WO2009/158631
PCT Pub. Date: Dec. 30, 2009

(65) Prior Publication Data
US 2011/0192233 A1 Aug. 11, 2011

Related U.S. Application Data

(60) Provisional application No. 61/076,032, filed on Jun. 26, 2008.

(51) Int. Cl.
*B22C 9/00* (2006.01)
*B22C 7/00* (2006.01)
*G03F 7/00* (2006.01)
*B82Y 10/00* (2011.01)
*B82Y 40/00* (2011.01)
*B29C 39/02* (2006.01)

(52) U.S. Cl.
CPC ............ *G03F 7/0002* (2013.01); *B82Y 10/00* (2013.01); *B82Y 40/00* (2013.01); *B29C 39/026* (2013.01)
USPC .................................. 164/6; 164/45

(58) Field of Classification Search
USPC ....................................... 164/6, 45
See application file for complete search history.

(56) References Cited

U.S. PATENT DOCUMENTS 6,812,990 B1    11/2004    Hofmann et al.
6,872,439 B2    3/2005    Fearing et al.
(Continued)

FOREIGN PATENT DOCUMENTS

WO    WO-03/102691 A1    12/2003
WO    WO-2005/031855 A1    4/2005
(Continued)

OTHER PUBLICATIONS

Bietsch et al., "Conformal Contact and Pattern Stability of Stamps Used for Soft Lithography," Journal of Applied Physics, vol. 88, No. 7, Oct. 2000, pp. 4310-4318.
(Continued)

*Primary Examiner* — Kevin P Kerns
(74) *Attorney, Agent, or Firm* — Wilmer Cutler Pickering Hale and Dorr LLP

(57) ABSTRACT

A method of forming a nanostructured surface, including providing an original nanostructured surface having an array of high aspect ratio structures formed on a planar substrate; forming a negative replica mold of the original nanostructured surface, where the negative replica mold includes a flexible material; deforming the negative replica mold; and using the deformed negative replica mold to form a deformed replica of the original nanostructured surface, where the deforming step is performed at least one of before, during, or after introducing a material for forming the deformed replica into the negative replica mold.

23 Claims, 28 Drawing Sheets

(56) References Cited

U.S. PATENT DOCUMENTS

| | | |
|---|---|---|
| 7,033,534 B2 | 4/2006 | Chiu et al. |
| 2003/0148401 A1 | 8/2003 | Agrawal et al. |
| 2005/0008821 A1 | 1/2005 | Pricone |
| 2005/0238967 A1 | 10/2005 | Rogers et al. |
| 2006/0021533 A1* | 2/2006 | Jeans ............................ 101/327 |
| 2006/0216413 A1 | 9/2006 | Saito et al. |
| 2006/0237881 A1* | 10/2006 | Guo et al. ...................... 264/496 |
| 2006/0279025 A1* | 12/2006 | Heidari et al. ................. 264/496 |
| 2007/0059213 A1 | 3/2007 | Aizenberg et al. |
| 2007/0059497 A1* | 3/2007 | Huang et al. ............... 428/195.1 |
| 2007/0077396 A1 | 4/2007 | Aizenberg et al. |
| 2007/0176320 A1* | 8/2007 | Nakamura et al. ............ 264/219 |
| 2007/0257396 A1* | 11/2007 | Wang et al. .................... 264/219 |
| 2008/0072357 A1 | 3/2008 | Aizenberg et al. |
| 2008/0095977 A1 | 4/2008 | Aizenberg et al. |
| 2009/0286936 A1* | 11/2009 | Ogata et al. ................. 525/328.8 |
| 2010/0021647 A1* | 1/2010 | Sitti et al. ...................... 427/457 |
| 2010/0098967 A1* | 4/2010 | Schroers et al. .............. 428/600 |

FOREIGN PATENT DOCUMENTS

| | | |
|---|---|---|
| WO | WO-2005/107938 | 11/2005 |
| WO | WO-2006/128189 A2 | 11/2006 |
| WO | WO-2009/158631 | 12/2009 |

OTHER PUBLICATIONS

International Search Report and Written Opinion of the International Searching Authority, the United States Patent and Trademark Office, for International Application No. PCT/US2009/048880, dated Nov. 17, 2009, 13 pages.

* cited by examiner

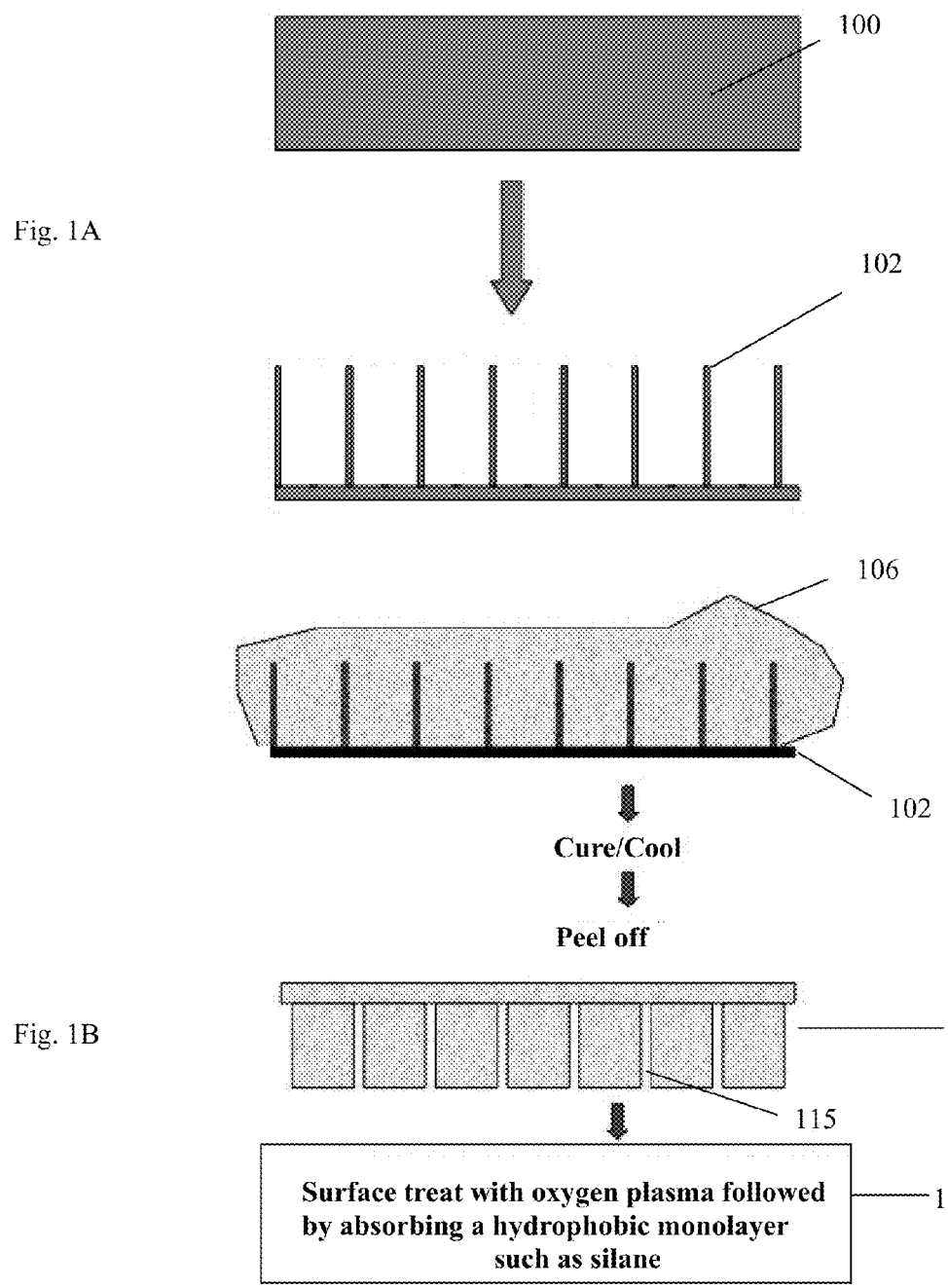

Figure 1 (cont)
Fig. 1C
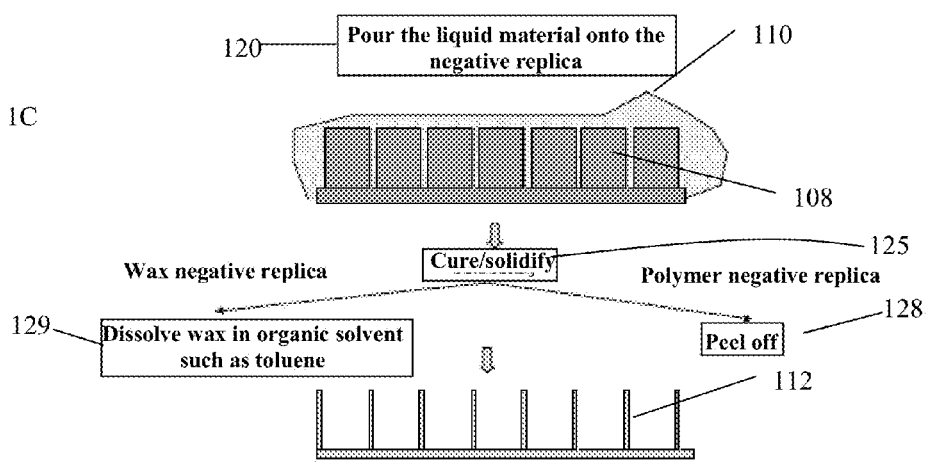
Fig. 1D
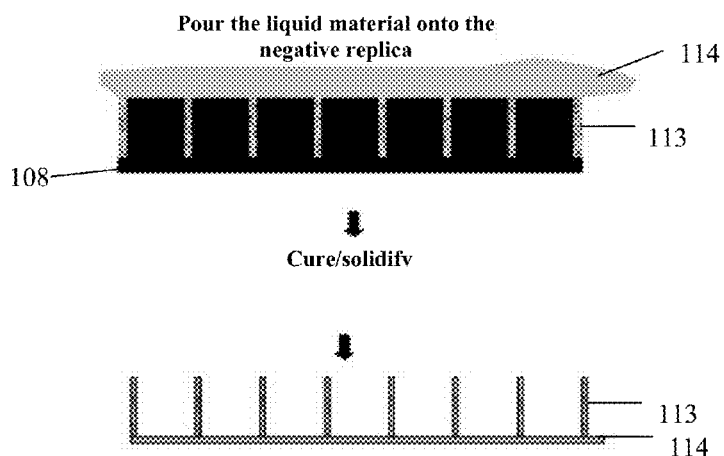

|—— 2 μm ——|

|— 1 μm —|

VERSATILE HIGH ASPECT RATIO ACTUATABLE NANOSTRUCTURED MATERIALS THROUGH REPLICATION

RELATED APPLICATIONS

This application claims priority to U.S. Provisional Patent Application No. 61/076,032, filed Jun. 26, 2008, which is hereby incorporated by reference in its entirety.

GOVERNMENT RIGHTS

This work was supported by the Materials Research Science and Engineering Center (MRSEC) of the National Science Foundation under NSF Award Number DMR-0213805. The United States Government may have certain rights to the invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

Nanostructured materials have been made by several different techniques, such as by conventional photolithography, e-beam writing, depositing nanowire arrays, growing nanostructures on the surface of a substrate, or by soft lithography techniques. The shape of the nanostructures, as well as their mechanical, thermal, magnetic, and other physical properties have been limited by the available fabrication methods. New fabrication methods that enable a range of nanostructured materials having a wider range of structures and physical properties are desirable.

SUMMARY

In general, the invention features methods and systems for fabricating nanostructures having a wide range of geometries and physical properties, and applications of these structures. The nanostructures are made using replica molding methods.

In one aspect, a method of forming a nanostructured surface is described.
The method including:
providing a negative replica mold of an original nanostructured surface having a plurality of high aspect ratio nanostructures, where the negative replica mold is comprised of a deformable material;
deforming the negative replica mold;
introducing a material into the negative replica mold to form a deformed replica of the original nanostructured surface, where deforming is performed at least one of before, during, or after the material for forming the deformed replica is introduced; and
removing the deformed replica from the negative replica mold.

In any of the above embodiments, the aspect ratio ranges from about 3 to about 100.

In any of the above embodiments, the plurality of high aspect ratio structures form an array.

In any of the above embodiments, the array defines a nanopost array.

In any of the above embodiments, the nanostructures have a width of about 10 nm to about 5 µm; a length of about 1 µm to about 1 cm and a pitch of more than about 100 nM.

In any of the above embodiments, the nanostructures have a width of about 100 nm to about 1 µm; a length of about 1 µm to about 500 µm and a pitch of more than about 100 nM.

In any of the above embodiments, the negative replica mold includes polydimethylsiloxane (PDMS).

In any of the above embodiments, the method further includes treating the replica's surface with an anti-stick agent.

In any of the above embodiments, the deforming includes subjecting the negative replica mold to one or more deformations selected from the group consisting of compression, tension, bending, torsional twisting and shear.

In any of the above embodiments, the deformation is a tensile deformation in the x, y or xy direction.

In any of the above embodiments, the deformation is a compressive deformation in the x, y, z or xy direction.

In any of the above embodiments, the deformation is selected to alter the distance between nanostructures.

In any of the above embodiments, the distance between nanostructures is altered by a factor of about 1/3 to about 3.

In any of the above embodiments, the deformation is selected to introduce a tilt angle into the nanostructures with respect to the surface.

In any of the above embodiments, the deformation introduces a tilt angle in the range of greater than 0° to about 65°.

In any of the above embodiments, the deformation is selected to reduce the aspect ratio of the nanostructure.

In any of the above embodiments, the nanostructure aspect ratio is reduced by a factor of up to 1/3.

In any of the above embodiments, the deformation is a tensile or compressive deformation in the xy direction.

In any of the above embodiments, the deformed nanostructures form a rhombus or parallelogram arrangement.

In any of the above embodiments, the deformation includes an angular shear deformation applied to an upper or lower surface of the negative mold.

In any of the above embodiments, the deformation includes bending the negative replica mold to form a convex or concave surface.

In any of the above embodiments, the material for forming the deformed replica includes polymer, ceramic, metal or metal alloy.

In any of the above embodiments, the polymer has a stiffness in the range of about 1 MPa to about 1 GPa.

In any of the above embodiments, introducing a material for forming the deformed replica into the negative replica mold includes:
introducing a first material into the negative replica mold;
introducing a second material into the negative replica mold and on top of the first material, where the deformed replica includes a first material layer formed from the first material and a second material layer formed from the second material, where the high aspect ratio structures of the deformed replica are formed predominantly by the first layer material.

In any of the above embodiments, the first and the second material layers of the deformed replica have different stiffness values.

In any of the above embodiments, the first material layer has higher stiffness value than the second layer material.

In any of the above embodiments, the negative replica mold of an original nanostructured surface includes:

a plurality of negative replica molds, said plurality of negative replica molds having the same or different original nanostructured surfaces, where the plurality of negative replica molds are arranged to form composite negative replica molds.

In any of the above embodiments, the composite negative replica mold defines a curved surface.

In any of the above embodiments, the plurality of negative replica molds are secured to one another along an edge of the negative replica mold.

In any of the above embodiments, where the plurality of negative replica molds are secured to an adhesive surface.

In any of the above embodiments, the material for forming the deformed replica is introduced by atomic layer deposition (ALD) or chemical vapor deposition.

In another aspect, a method of forming a nanostructured surface is described. The method includes:

providing a negative replica mold of an original nanostructured surface having a plurality of high aspect ratio nanostructures, where the negative replica mold includes recesses that correspond to the high aspect ratio nanostructures of the original nanostructured surface;

introducing a first material into the negative replica mold, said first material having a first selected characteristic;

introducing a second material into the negative replica mold, said material having a second selected characteristic; and removing the replica from the negative replica mold to obtain a hybrid nanostructure.

In any of the above embodiments, the material for forming the replica is introduced by vapor deposition.

In any of the above embodiments, the first material forms a first conformal layer on at least a portion of the surface of the negative replica mold at a thickness that is not sufficient to fill the recesses of the negative replica mold.

In any of the above embodiments, the second material is deposited on the first conformal layer.

In any of the above embodiments, the first material is deposited in the recesses of the negative replica mold and the second material is deposited to the upper surface of the negative replica mold to provide a backing.

In any of the above embodiments, the first material is selected to provide a nanostructure of desired stiffness and the second material is selected to provide a backing having a stiffness less than that of the nanostructure.

In any of the above embodiments, the first material is deposited in the recesses of the negative replica mold in an amount to fill a first portion of the recesses and the second material is deposited to fill a second portion of the recesses, where the first and second materials are selected to provide a first property to the first portion of the nanostructure and the second material is selected to provide a second property to the second portion of the nanostructure.

In any of the above embodiments, the first material is deposited into a first set of recesses and the second material is deposited into a second set of recesses.

In any of the above embodiments, the method further includes:

providing a mask in sealing contact with the negative replica mold to expose a first set of recesses;

applying a first material to the negative replica mold to fill the first set of recesses with the first material; and removing the mask and applying a second material to the negative replica mold.

In any of the above embodiments, the negative replica mold of an original nanostructured surface includes:

a plurality of negative replica molds, said plurality of negative replica molds having the same or different original nanostructured surfaces, where the plurality of negative replica molds are arranged to form composite negative replica molds.

In any of the above embodiments, the composite negative replica mold defines a curved surface.

In any of the above embodiments, the plurality of negative replica molds are secured to one another along an edge of the negative replica mold.

In any of the above embodiments, the plurality of negative replica molds are secured to an adhesive surface.

In yet another aspect, a method of forming a nanostructured actuator is described. The method includes:

providing a negative replica mold defining a nanostructured surface, said nanostructured surface having a plurality of high aspect ratio structures formed on a substrate, each of the high aspect ratio structures defining a base region where the structure joins the substrate;

introducing a material into the negative replica mold to form a replica of the nanostructured surface;

removing the replica from the negative replica mold; and depositing a layer of an actuator material on the surface of the replica, where the actuator material contacts a plurality of the high aspect ratio structures at the base region, and where actuating the actuator material causes the actuator material to exert a force on the plurality of the high aspect ratio structures.

In yet another aspect, a nanostructured actuator having a nanostructured surface is described. The actuator includes:

a molded array of high aspect ratio structures on a backing; and an actuating material, where the actuator material is responsive to an external trigger that causes the actuator material to exert a force on at least one of the high aspect ratio structures to move the structure from a first position to a second position.

In any of the above embodiments, the high aspect ratio structures are comprised of the actuating material.

In any of the above embodiments, the actuating material contacts a portion of the high aspect ratio structures.

In any of the above embodiments, the high aspect ratio structures include an actuator material selected from the group consisting of magnetic, piezoelectric or temperature sensitive materials.

In any of the above embodiments, the high aspect ratio structures include an actuator material composed of a magnetic material and actuating accomplished by changing the magnetic field.

In any of the above embodiments, the magnetic material is selected from the group consisting of ferromagnetic and superparamagnetic materials.

In any of the above embodiments, the magnetic material is a layer disposed on the high aspect ratio structures.

In any of the above embodiments, the magnetic material are particles embedded in the high aspect ratio structures.

In any of the above embodiments, the high aspect ratio structures include an actuator material composed of a piezoelectric material and actuating accomplished by changing the electric field.

In any of the above embodiments, the high aspect ratio structures include an actuator material composed of a temperature sensitive material and actuating accomplished by changing the temperature.

In any of the above embodiments, the temperature sensitive material includes a polymer with a glass transition temperature.

In any of the above embodiments, the temperature sensitive material includes a polymer with a hydrogel.

In any of the above embodiments, the actuator material forms a layer at a base area of the high aspect ratio structures where the structures meet the substrate.

In any of the above embodiments, the actuating material includes a heating element positioned to heat a selected region of the high aspect ratio structures.

In any of the above embodiments, the heating element includes a resistive metal element.

In yet another aspect, a nanostructured flow meter having a nanostructured surface is described. The flow meter includes:

an array of high aspect ratio structures formed on a substrate, where the high aspect ratio structures deflect in response to an applied force or flow; and a detector to measure the deflection.

In yet another aspect, an anti-fouling surface having a nanostructured surface is described. The anti-fouling surface includes:

an array of high aspect ratio structures formed on a planar substrate, where the high aspect ratio structures form a superhydrophobic actuating surface.

In yet another aspect, a conduit having low drag is described. The conduit includes:

a conduit having an inner surface in contact with a fluid flow; and a nanostructured surface applied to at least a portion of the inner surface, the surface including a plurality of high aspect ratio structures formed on a substrate, where the high aspect ratio structures form a superhydrophobic surface.

In yet another aspect, an adhesive surface is described. The surface includes:

a first nanostructured surface including a plurality of high aspect ratio structures formed on a first substrate; and a second nanostructured surface including a plurality of high aspect ratio structures formed on a second substrate, where the first and second nanostructured surfaces are in facing relationship and where a plurality of the high aspect ratio structures on each of the first and second nanostructured surfaces are mechanically interlocked.

In any of the above embodiments, the first and second nanostructured surfaces are complementary.

In yet another aspect, a method of trapping particles is described. The method includes:

exposing a nanostructured surface including an arrangement of a plurality of high aspect ratio structures, the structures capable of deflection in response to a force, to a sample including at least one particle, the particle of a dimension commensurate with a dimension of the nanostructured surface, where the high aspect ratio structures deform and entrap the particle.

In yet another aspect, a composite is described. The composite includes:

a matrix having a plurality of high aspect ratio structures, where the structures are organized as an array within the matrix.

In yet another aspect, a method of forming a hybrid nanostructured surface is described. The method includes:

providing a negative replica mold of an original nanostructured surface having an array of high aspect ratio structures, introducing a material into the negative replica mold, where the material is capable of a change of a property when exposed to a selected energy;

positioning a patterned mask over the negative replica mold, where the mask includes first and second regions having different transmissivities of the selected energy; and applying the selected energy to the patterned mask, where the material in the negative replica mask is exposed to different energy intensity to form a patterned nanostructured surface.

In any of the above embodiments, the negative replica mold includes a deformable material, and the deformable negative replica mold is deformed at least one of before, during, or after the material is introduced.

In any of the above embodiments, the selected energy is selected from the group consisting of UV and IR.

In any of the above embodiments, the first region is substantially opaque to the selected energy and the second region is substantially transparent to the selected energy.

In any of the above embodiments, the mask is positioned in a first position to expose a first set of recesses to the selected energy in a first exposing step and the mask is positioned in a second position to expose a second set of recesses to the selected energy.

In any of the above embodiments, the material in the first and second set of recesses is the same and the dose of the selected energy is different.

In any of the above embodiments, the material in the first and second set of recesses is different.

In any of the above embodiments, the method further includes;

introducing a first material into the negative replica mold;

exposing the first set of recesses to the selected energy in the first exposing step to form a first set of nanostructures corresponding to the first set of recesses, removing the unexposed first material from the negative replica mold after the first exposing step;

introducing the second material is introduced into the negative replica mold; and exposing the second set of recesses to the selected energy in the second exposing step to form a second set of nanostructures corresponding to the second set of recesses.

In any of the above embodiments, the first and second materials includes UV curable polymers.

In any of the above embodiments, the method further includes;

introducing a first material into the negative replica mold;

exposing the first set of recesses to the selected energy step to form a first set of nanostructures corresponding to a first set of recesses, removing the unexposed first material from the negative replica mold after the first exposing step;

introducing a second material the negative replica mold to form a second set of nanostructures corresponding to a second set of recesses.

In any of the above embodiments, the first material includes UV curable polymers and the second material is selected from the group consisting of polymers, metals and ceramics.

In any of the above embodiments, the first and second regions includes different levels of transmissivity of the selected energy.

In any of the above embodiments, the property is selected from the group consisting of stiffness and surface chemistry.

In any of the above embodiments, the energy is UV and the material is selected from epoxy, polystyrene, polyurethane, and polyethylene polymers and prepolymers thereof.

As used herein, a flexible or a deformable material refers to a material that can be deformed, when subjected to a deformation force such as compression, tension, bending, torsional twisting or shear, without material failure and is capable of returning to its original form.

BRIEF DESCRIPTION OF THE DRAWINGS

Various objects, features, and advantages of the present invention can be more fully appreciated with reference to the following detailed description of the invention when considered in connection with the following drawings, in which like reference numerals identify like elements. The following drawings are for the purpose of illustration only and are not intended to be limiting of the invention, the scope of which is set forth in the claims that follow.

FIGS. 1A-1C provide a schematic illustration of a process for producing replicas of high aspect ratio nanostructures; FIG. 1D provides a schematic illustration of a process for producing replicas of high aspect ratio nanostructures where the high aspect ratios nanostructures and the backing are made of different materials.

DETAILED DESCRIPTION

Figure 2:
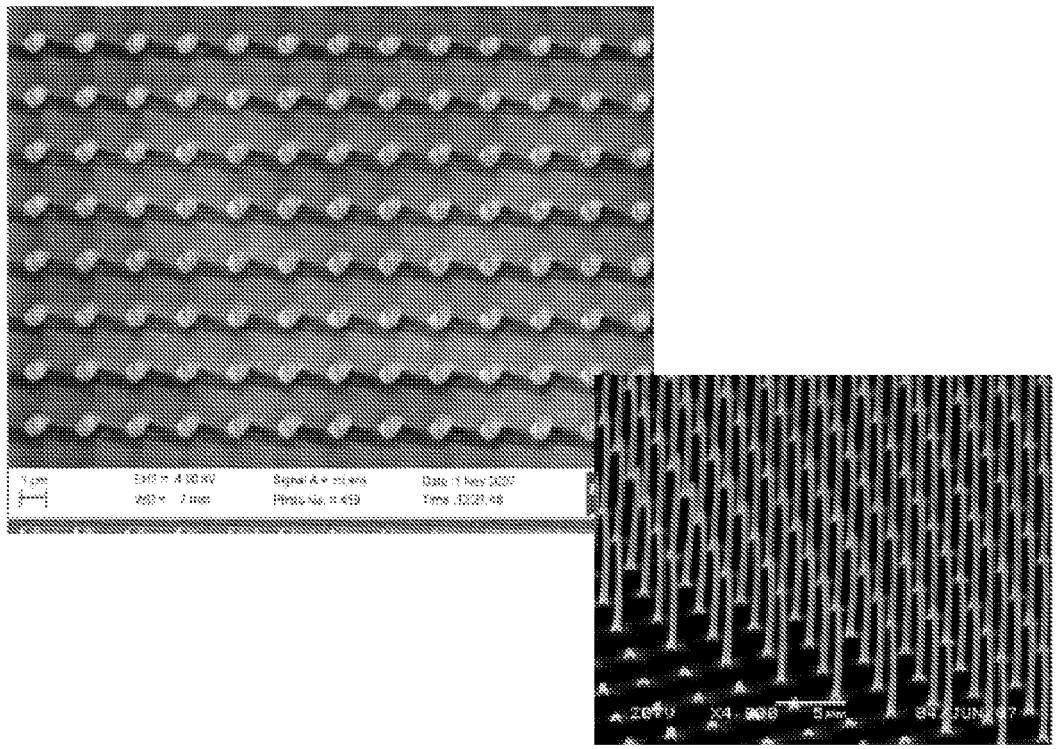
FIG. 2 is an image of an epoxy replica of high aspect ratio nanopost arrays.

High aspect ratio nanostructure replicas are described herein. In some embodiments, the material compositions of the high aspect ratio nanostructure replicas could be controlled to produce replicas with desired properties. In some specific embodiments, high aspect ratio nanostructure replicas made of more than one types of materials are described. In some embodiments, the geometries of the negative replica could be controlled and high aspect ratio nanostructure replicas with a variety of geometries different from the original high aspect ratio nanostructures could be produced.

High aspect ratio nanostructures find application in a wide range of fields. High aspect ratio nanostructures are used to form superhydrophobic surfaces and in other applications where water repellence and self-cleaning properties are useful.

High aspect ratio nanostructures may also be used for activation, so that the nanofeatures, individually or in combination, can react to the appropriate stimulus, for example, magnetic, electric, piezoelectric, acoustic or thermal stimuli.

The methods of replicating high aspect ratio nanostructures in a variety of materials, including polymers, metals, or ceramics are described. The original structures that are replicated include arrays of nanowires produced by traditional lithography, nanowires grown on a substrate (such as carbon nanotubes, ZnO, ZnS, etc.), nanostructured biological materials, and other nanostructures. The described methods enable fabrication of highly versatile nanostructures that add new physical and chemical properties to the original surfaces. These properties enable mechanical actuation and assembly, and the tuning of mechanical, magnetic, piezoelectric, electric, or wettability properties. The new structures also make it possible to have full control of the glass transition temperature of the replicated material so as to regulate the mechanical properties as a function of temperature. One feature of the fabrication process is the ability to change the geometry of the generated array and produce anisotropic nanostructures whose size, tilt, cross-section, pitch, twist and 3D arrangement are different from the original structure and can be finely regulated. The features of the nanostructure can range from ordered, regular repeating arrays to structures of varying sizes, patterns, organization and materials on a surface.

Fabrication

The fabrication techniques involve replica molding of high aspect ratio structures. As used herein, aspect ratio refers to the ratio of a structure dimension perpendicular to the plane of a substrate from which the structure protrudes, e.g., length, and a dimension of the structure in the plane of a substrate, e.g., width. In the described embodiments, replicated structures have aspect ratios of up to about 50:1 and greater.

FIG. 1 illustrates the steps involved in the production of a high aspect ratio nanostructure replica. In the first step, FIG. 1A, the desired high aspect ratio nanostructure 102 is formed using any desired technique, such as photolithography using a traditional material 100 such as silicon or GaAs, or by growth or self-assembly of nano-wires, nanotubes or other natural biological or geological nanostructure. The original replica can be formed using traditional fabrication techniques such as photolithography, e-beam and the like. Although such techniques can be time consuming and costly, they are acceptable methods for forming the original, as only a single replica need to be prepared. The features of the nanostructured replica can have a range of dimensions. For example, the features can have a moderate aspect, e.g., ca. 3 or more up to high features of 50 or 100 aspect ratio. The features can have dimensions of nanometers in width, e.g., greater than 10 nm, or microns in width, e.g. greater than 1 µm and up to about 1 cm in width and can be quite long, e.g., greater than 100 nm or greater than 10 µm and up to several cm in length. The spacings between the features could be at the length scale of the width of the features, e.g. greater than 100 nm, or significantly more separated, e.g. at the distances commensurate with the lengths of the features. Typically, the features are of regular profile, without complex underhangings, so that they can readily replicated by mold casting.

In one non-limiting example, a 2D array of posts is made from silicon by standard Deep Reactive Ion Etching (DRIE) using the Bosch process and has a pitch range (e.g., a distance between centers of adjacent features) from about 0.5 microns to 14 microns, height range of about 2-10 microns, and post diameter range of about 100 nm to 1 micron. In some embodiments, other geometries and feature sizes can be used.

In the second step, shown in FIG. 1B, a negative replica mold 108 of the original structure is formed using a suitable replica material. Exemplary materials include but not limit to those that can be melted to liquid and cooled to harden to the final form. Wax, e.g., paraffin wax, is an example of such a replica material. In other embodiments, the replica material can be a polymer or prepolymer 106 that cures, using for example heat or uv or any curing agent, to provide a permanent negative replica of the nanostructure 108. The curable polymer can be a flexible elastomeric polymer that can be deformed, but which retains and returns to its original cast form. Exemplary flexible and/or curable polymers include silicone rubbers and siloxanes of various compositions, such as polydimethylsiloxane (PDMS); polyurethanes, or other moldable polymers and resins, such as poly(ethylene glycol) diacrylate (PEGDA), alginates.

In some embodiments, the mold is made of PDMS, and prepolymer 106 is poured over the nanostructure 102 to be replicated and kept under vacuum, e.g., for about one hour, to remove bubbles that may form between the polymer and the nanostructure. Curing of the polymer is then initiated. In some embodiments, the mold is made of paraffin wax, and the wax replica material is melted, and poured over the original structure. The wax is kept hot for several minutes to ensure that the wax penetrates fully around the nanostructure, and is then cooled and removed from the original structure to produce the negative replica 108 with recesses such as 115. Desirably, the negative replica is able to peel off easily without disrupting the silicon fine structure, so that the nanofeatures can be accurately replicated over a large scale. To this end, the original replica can be treated to reduce surface sticking as indicated by process 118. Any suitable surface treatment may be used. A non-limiting example is (heptadecafluoro-1,1,2,2-tetra-hydrodecyl)trichlorosilane. In some non-limiting embodiments, the negative replica is a silicone polymer such as PDMS and the PDMS is surface treated with ozone and then treated chemically with an anti-stick thin coating, as illustrated in process 118.

Next, the replica is made using the negative replica 108 as a mold (FIG. 1C). In this process, a replica material 110 is applied to the negative replica 108 so as to completely fill the negative replica leaving no gaps or holes. As illustrated in process 120, a material is introduced into the negative replica. The replica material can vary widely depending on the desired properties of the replica and the replica nanostructure can be fabricated from almost any material that can be cast or deposited or grown. For example, the replica can be prepared from flexible or thermoplastic polymers, such as PDMS, thermoset polymer, metals or even ceramics. For polymers and metals, a molten precursor, such as a polymer precursor or liquid metal, can be used to cast the replica. In the case of ceramics, the replica material can be deposited into the negative mold, for example using chemical or physical vapor deposition methods. If a liquid material is cast, the liquid is then cured or solidified, as illustrated by process 125. For replicas made out of polymer, a liquid precursor of the polymer (prepolymer) is poured into the mold, filling the wells corresponding to the high aspect ratio structures. The polymer is then formed when the prepolymer is cured either with UV or by heat. The material completely fills the negative replica and solidifies inside it. In order to prevent the formation of bubbles trapped between the mold material and the original structure, a vacuum is applied over the liquid. Once the material has solidified the negative replica is simply peeled off in the case of a flexible polymer negative mold as illustrated by process 128 or dissolved away in the case of a wax mold as illustrated by process 129, leaving behind the free-standing nanostructured material 112. The nanostructure 112 can then either be used for a variety of applications, as described below, or can be used as a master for further replications. In the latter case, the nanostructure is coated with an anti-sticking thin layer, such as fluorinated silane for future castings.

In one or more embodiments, replicas can be made from a large variety of replica material including polymers such as epoxy, polypropylene (PP), polyethylene (PE), polyvinylalcohol (PVA), poly methyl methacrylic acid (PMMA), and various hydrogels and biological macromolecules, e.g. alginates, collagen, agar; metals and alloys which have a low melting point, such as InBi and woods alloy; and ceramics including $Al_2O_3$, $HfO_2$, $SiO_2$, ZrO, and $BaTiO_3$. Other polymeric materials, metals, alloys and ceramics can be used in the similar manner. Polymers have the advantage of having liquid monomer precursors that can be poured into the mold, and then polymerized in situ. The replicas can also be made out of metal alloys that have low melting points, i.e., below about 150 degrees C. These alloys can be cast in the liquid phase on the negative replicas and allowed to solidify.

FIG. 2 is an electron micrograph showing an epoxy nanopost array prepared using epoxy as the replica material according to one or more embodiments. The perspective view in FIG. 2B in the lower right hand corner shows the extremely fine and regular features that are achievable using the molding methods according to one or more embodiments.

A soft lithography technique is a low-cost alternative to the conventional lithography and has been shown to be an extremely powerful method for the high-resolution replication of microfabricated substrates in an elastomeric polymer—polydimethylsiloxane (PDMS). PDMS has been widely used to form polymeric arrays of micron-sized posts for a variety of applications, including control of cellular adhesion and wettability. Due to the low level of stiffness of PDMS, only limited aspect ratios were achievable, and irreversible collapse was shown to occur in high-aspect-ratio posts.

In one embodiment, the soft lithography replication method is used to allow the fabrication of an array of stable, high-aspect-ratio features, which represents a critical functional requirement of actuated nanostructures and sensors. In one approach, PDMS is not the final nanostructured material: it is used as a secondary elastomeric mold for casting the replica in the material of choice. As a result, the stability and stiffness of the replicated structures can be controlled by choosing as the final material one with the desired mechanical properties.

The stiffness and/or the glass transition temperature of the resulting material can be controlled, in the case of epoxy for example, by varying the amount of an epoxy softener. For example, the above epoxy resins could be mixed with epoxy resins having a range of different concentrations and a very large variation in stiffness could be obtained, ranging from about 1 MPa to about 10 GPa. Other additives are known for polymers and may be used according to one or more embodiments.

Figure 3:
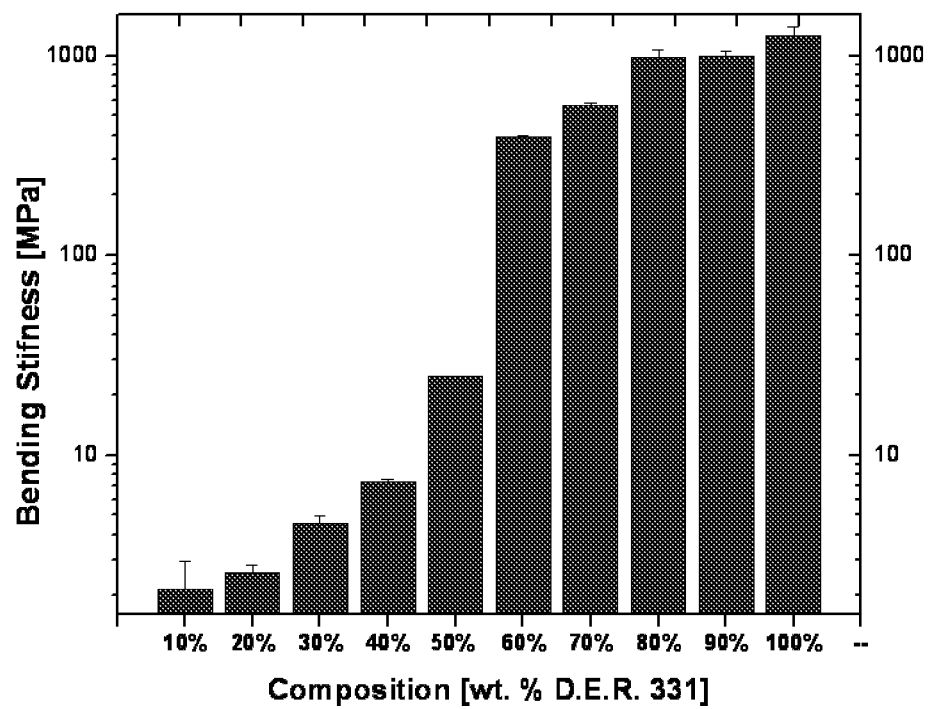
FIG. 3 shows a histogram presenting four orders of magnitude in post flexural modulus as a function of the ratio of D.E.R. 331 (stiff epoxy resin) to D.E.R. 732 (soft epoxy resin) in weight percent.

For example, the stiffness of the nanostructured array with the same geometry can vary from a few MPa to hundreds of GPa when the replicas are made out of polymers and metals/ceramics, respectively. The stiffness of the array can be finely tuned by mixing in different proportions two polymers that show high and low stiffness. In the illustrated embodiment of FIG. 2, for example, the nanopost structure was fabricated with epoxy resins purchased from the DOW company. High viscosity epoxy resin D.E.R.™ 331™ (stiff liquid epoxy resin) was mixed with low viscosity epoxy resin D.E.R.™ 732™ (soft liquid epoxy resin) so as to obtain the desired stiffness of the final material. 5 wt % CYRACURE UVI 6976™ (a mixture of triarylsulphonium salts with the hexafluoroantimonate $SbF_6$ anion; DOW Chemical) was used as UV photoinitiator. Similar results were obtained using a premixed epoxy that already contains a UV photoinitiator (EPO-TEK UVO-114™, a single component, UV curable epoxy) by Epoxy technologies Inc. Epoxy structures with a stiffness that ranges from a MPa to several GPa, a range of four orders of magnitude, can be produced using two epoxy-based polymers: a high-viscosity resin with a postcure higher modulus, and a low viscosity resin with a postcure low modulus. (FIG. 3). FIG. 3 shows a histogram presenting four orders of magnitude in post flexural modulus as a function of the ratio of D.E.R.™ 331™ (stiff liquid epoxy resin) to D.E.R.™ 732™ (soft liquid epoxy resin)in weight percent. The tests were performed on a 4-point flexure tester and thus reflect pure bending conditions. The nanoposts were 250 nm wide, 8 microns long and had a spacing of 2 microns. FIG. 3 can be then used as a calibration curve to define the recipe for a polymer mixture that will endow a nanopost array with an arbitrary, required stiffness in the MPa-GPa range. This provides the ability to fine-tune the sensing/actuation capability of the nanostructures.

Figure 4:
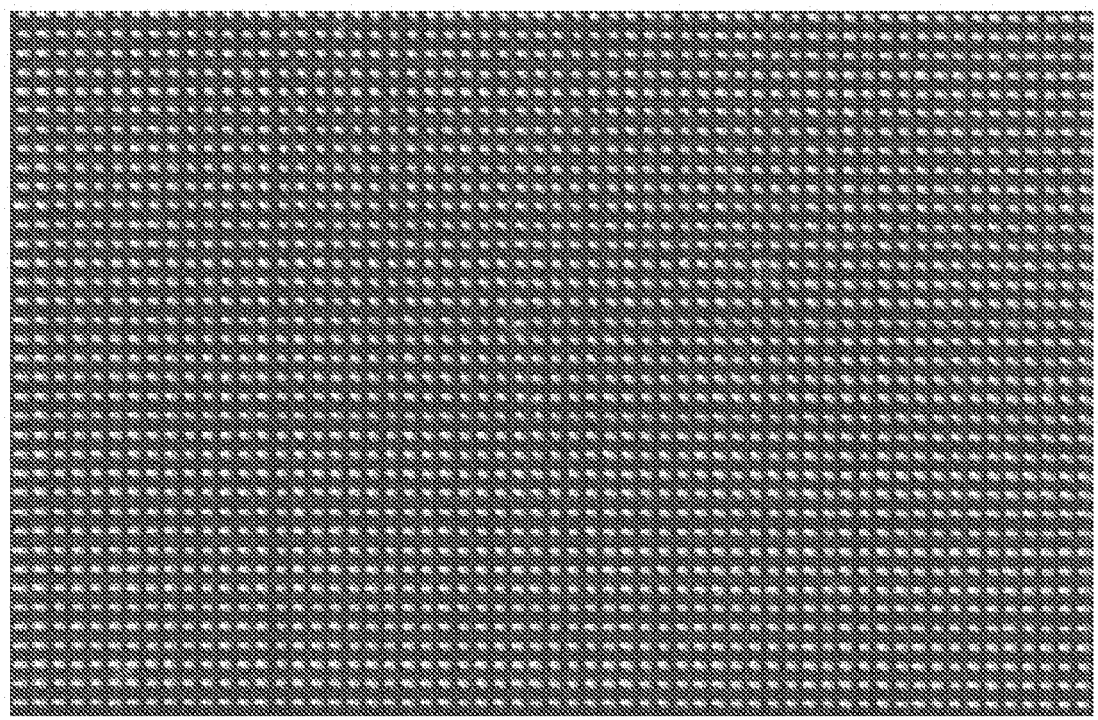
FIG. 4 is an image of an $Al_2O_3$ nanopost array made using the ALD process.

Replication does not require liquid casting materials. In some embodiments, the replicas can be prepared using physical or chemical vapor deposition techniques. In one embodiment, ceramic replicas are made by atomic layer deposition (ALD), which grows the ceramic material from the gas phase, layer by layer. This method is attractive because ALD can produce highly conformal surfaces so that features of extremely high aspect ratio can be prepared. Such techniques are known and are contemplated for use in preparation of nanostructures according to one or more embodiments. In one or more embodiments, a ceramic material is deposited into very small, high aspect ratio grooved structures. With ALD it is possible to deposit coatings perfectly uniform in thickness inside deep trenches, porous media and around particles. The feature thicknesses ranging from 10-500 nm are possible. A wide variety of ceramics can be grown in this way, including $Al_2O_3$. $HfO_2$, $SiO_2$, ZrO, and $BaTiO_3$. ALD also permits the use of monolithic metals, such as Pt, Ni. Co, Fe, and W. FIG. 4 shows electron microscope images of a ceramic $Al_2O_3$ replica that were fabricated using a PDMS mold and ALD. The PDMS negative mold was annealed over night in a vacuum oven at 220° C. so as to eliminate any volatile matter that would interfere with the ALD process. The $Al_2O_3$ deposition was performed using alternating cycles of $Al(CH_3)_3$ and $H_2O$ each of 1 sec pulse and an idle time of 2 seconds.

A flexible mold can be used to facilitate the release of the vapor-deposited replica. For this procedure, the flexible negative mold is prepared as described above with reference to FIG. 1B. Once this mold is made, it is heated in a vacuum oven at a temperature of 200° C. for 3 hours so as to outgas any residual volatiles. After this, the mold is placed in the ALD apparatus for the deposition of a required material.

The methodology described provides a versatile route to a range of nanostructures. A given geometrical nanostructure and deformations of that structure can be made from a variety of materials with different physical properties.

Figure 5A:
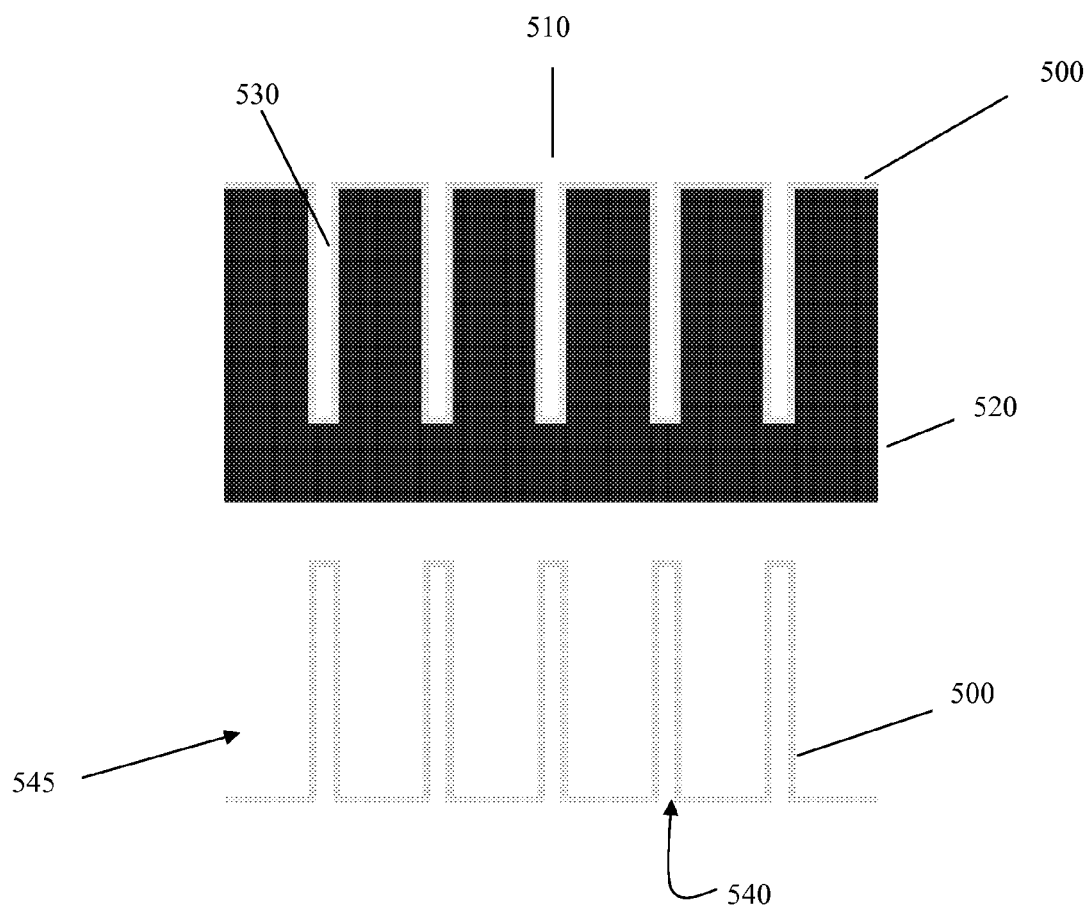
FIG. 5A is a schematic illustration of a molding method using a vapor deposition process according to one or more embodiments in which a conformal layer is deposited that does not completely fill the negative mold recesses to produce a nanostructure article having nanofeatures with a hollow core.
Figure 5B:
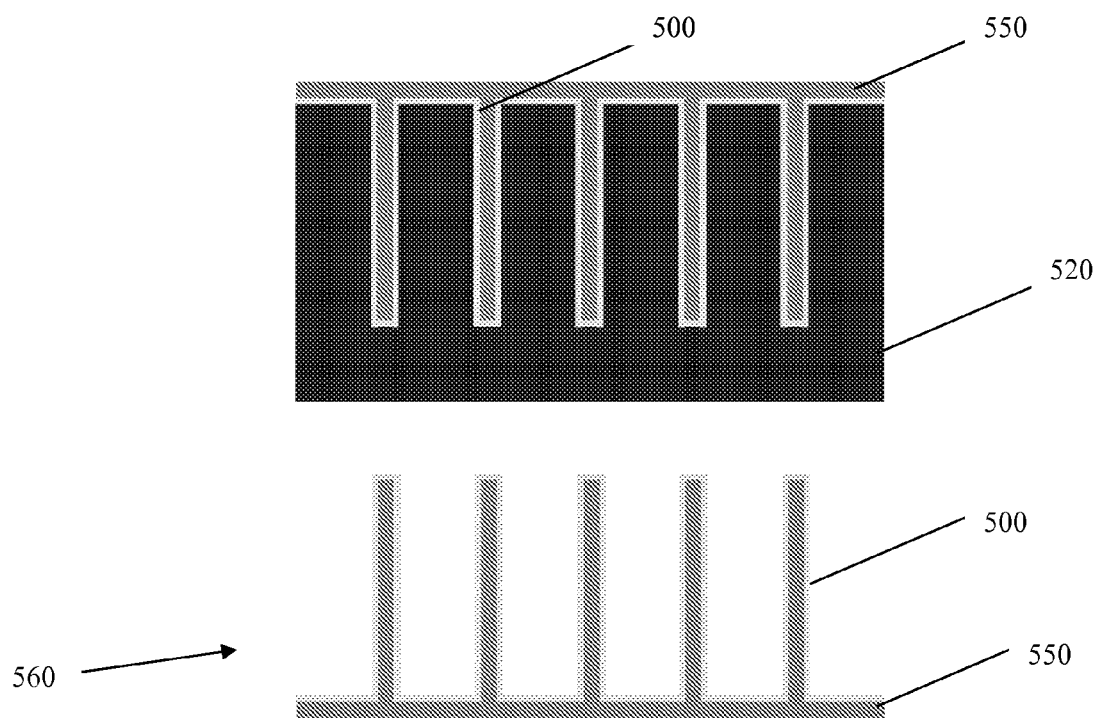
FIG. 5B is a schematic illustration in which the mold of FIG. 5A is further filled with a second material to produce a nanostructure article having nanofeatures made up of two different materials.

Vapor deposition provides a versatile approach for the preparation of a range of structures. In one or more embodiments, hollow structures can be formed that can be used for different applications as described below. As shown in FIG. 5A, a thin layer of ceramic material 500 can be conformally deposited into recessed features 510 of a negative replica 520 to define nanoposts, however, the deposited layer is sufficiently thin that a portion of the negative replica as indicated by 530 remains unfilled. Once removed from the negative mold, a nanostructure 545 is obtained having hollow core nanopost features 540. As shown in FIG. 5B, this method also enables the fabrication of hybrid-material nanoposts 560 by first depositing a first layer 500 of one material into the recessed features of a negative replica 520 followed by filling the core of the posts with another material 550. The second step could be carried out by vapor deposition or by using a liquid fill material.

The negative replica fabrication methods described above enable the formation of high aspect ratio structures made of materials that could not be grown or directly deposited onto substrates without collapsing. This problem is overcome by using the negative mold in which the high aspect ratio structures correspond to deep wells within a monolithic block of material. Since the walls of the well are thick, the molds are structurally very stable, and there is little risk of collapse. The material from which the replica is formed can be poured or deposited into these stable wells, and cured or otherwise allowed to solidify into self-supporting structures before the mold is removed.

A feature of using a polymeric negative replica mold is that a single mold can be used to produce many replicas, for example a few hundred or more. This is because they are not dissolved or melted in the process of making a replica. In addition, since the mold is flexible, a single mold can be deformed in various ways and reused to make replicas having corresponding deformed geometries. The fabrication of the original silicon structure or a grown nanowire array is extremely expensive, so this represents a cost savings. Moreover, a variety of deformed geometries are provided, as described below, that cannot be achieved by traditional lithography or by nanowire growth.

In other embodiments, a "scale-up" process of producing large areas of high aspect ratio nanostructures is provided. A plurality of negative replicas, which can be the same or different, are joined to form a large surface area composite negative replica. In some embodiments, two or more single negative replicas can be joined along an edge of the negative replicas. If the negative replicas are made of flexible materials, such as PDMS, the edges are sufficiently adhesive so that simple contact will effectively join the replicas. In other embodiments, the replicas can be assembled on an adhesive surface, e.g., contact paper, or an adhesive can be applied to the backing of the negative replica. If the negative replicas are flexible, the composite negative replica can be shaped to conform to the underlying surface, which can be flat, non-planar, concave, or convex.

Figure 6:
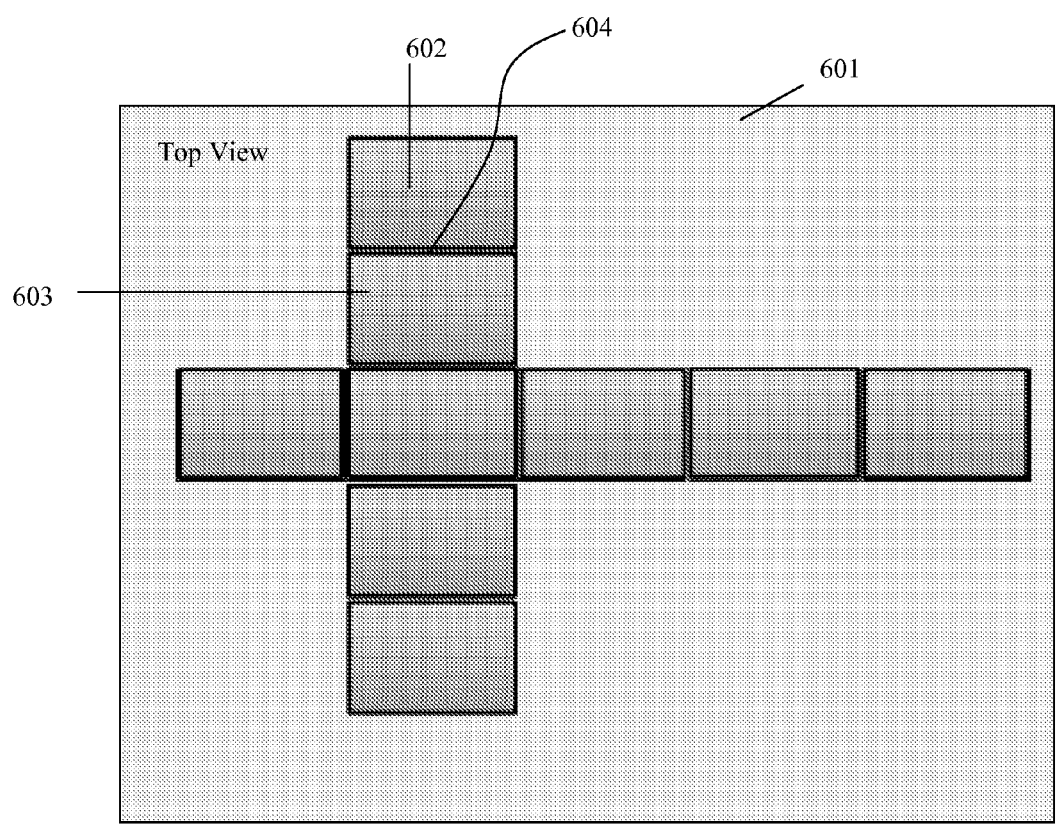
FIG. 6 is a schematic illustration of a scale-up process for producing replicas of high aspect ratio nanostructures using two or more negative replica molds attached together as a mold.

As shown in FIG. 6 from a top view, single negative replicas 602 and 603 are joined and attached along an edge 604 and positioned on surface 601. Also as shown in FIG. 6, additional single negative replicas can be joined to form a composite negative replica of any shape or size. In some embodiments, the single negative replicas are attached to the surface 601 by applying an adhesive on the bottom of the single negative replica and then attaching the single negative replicas to the surface. In other embodiments, the single negative replicas are made of polymers such as PDMS and are attached together due to the natural stickiness of the polymer. The thickness of the backings of the single negative replica can be controlled to be the same during fabrication of the negative replicas so that the thickness of the overall backing of the composite negative replica is consistent. The formed composite negative replica can then be replicated using any of the methods described above to produce a large area of high aspect ratio nanostructures which is complementary to the composite negative replica. Thus, by this method, the replication process can be easily "scaled up" by joining the same single negative molds together on a surface and then replicating the composite mold. In addition, when a variety of different single negative replicas are combined and replicated, arrays of nanostructures of any size or shape can be fabricated.

Hybrid Nanostructures with Customized Properties

In one or more embodiments, a hybrid nanostructure is provided. By "hybrid" structure, it is meant that the nanostructure is made of two or more materials that may impart different properties to the hybrid structure. Other hybrid structures include nanofeatures, e.g., posts, made up of different materials. For example, the base of the nanopost can be made from a first material that is the same or different from the base and the tip of the post can be made of a second material. The material at the tip of the nanopost can include a material that is responsive to a selected stimulus, for example, an electric or magnetic field. The remainder of the nanopost can be made of a material selected to provide the desired stiffness to the nanopost. The base can be made of yet a third material that is flexible to allow for conformation to the underlying surface.

In some embodiments, a high aspect ratio nanostructure made of more than one type of material can be constructed. The hybrid structure can include different materials for the backing or base and nanofeatures, as exemplified in FIG. 1D. In some embodiments, the posts 113 of the nanostructure are made of a first type of material and the backing 114 of the hybrid posts are made of a second type of material. As illustrated in FIG. 1D, the recesses 115 of the negative replica 108 are first filled with material 113 to form the nano-sized post. Excess material 113 is removed from the mold. Next, a second material 114 is applied to provide the material for the backing of the nano-sized hybrid posts. After the curing process (which can take place simultaneously, e.g., posts and backing are cured together or sequentially, e.g., posts are cured before application of the backing material) and the removal of the negative replica, a high aspect ratio nanostructure is having nano-sized posts made of material 113 and backing made of material 114 is obtained. The two types of materials used to construct the nano-sized hybrid posts and their backings can have different characteristics and properties.

In some embodiments, the two materials have different mechanical optical or magnetic or electrical properties, that can be selected to provide a desired functionality to the nanostructure. For example, the two materials can have different stiffnesses. In some specific embodiments, epoxy resins that have different stiffness values can be used to construct the nano-sized hybrid posts and their backings. In some embodiments, the nano-sized posts are made of an epoxy with a high Young modulus value (stiff) and the backing from an epoxy with a low Young modulus value (soft). Such nanostructures have the advantage of a flexible backing that permits the posts to tilt back and forth easily (as their anchoring points are very soft, i.e., soft backings). The flexible backing also allows the nanostructure to conform to non-planar surfaces. Hybrid posts made of a high modulus material do not adhere to one another easily so that assembly or clustering of posts can be controlled.

Such a hybrid structure can be used as an antifouling surface and be incorporated in flow channels (drag reduction) and even blood vessels as further discussed below. The posts would actuate back and forth by the flow and prevent fouling or biofilm formations. In some embodiments, the soft backing of the posts could be mechanically stretched to change the spacing of the posts without bending the posts.

In other embodiments, the hybrid nanostructure can include an outer region and an inner core region, such as exemplified in FIG. 5B.

In still other embodiments, a first group of nanofeatures can be made of a first material and a second group of nanofeatures can be made of a second material. The first and second groups of nanofeatures can be located in preselected patterns on the nanostructure.

Figure 7:
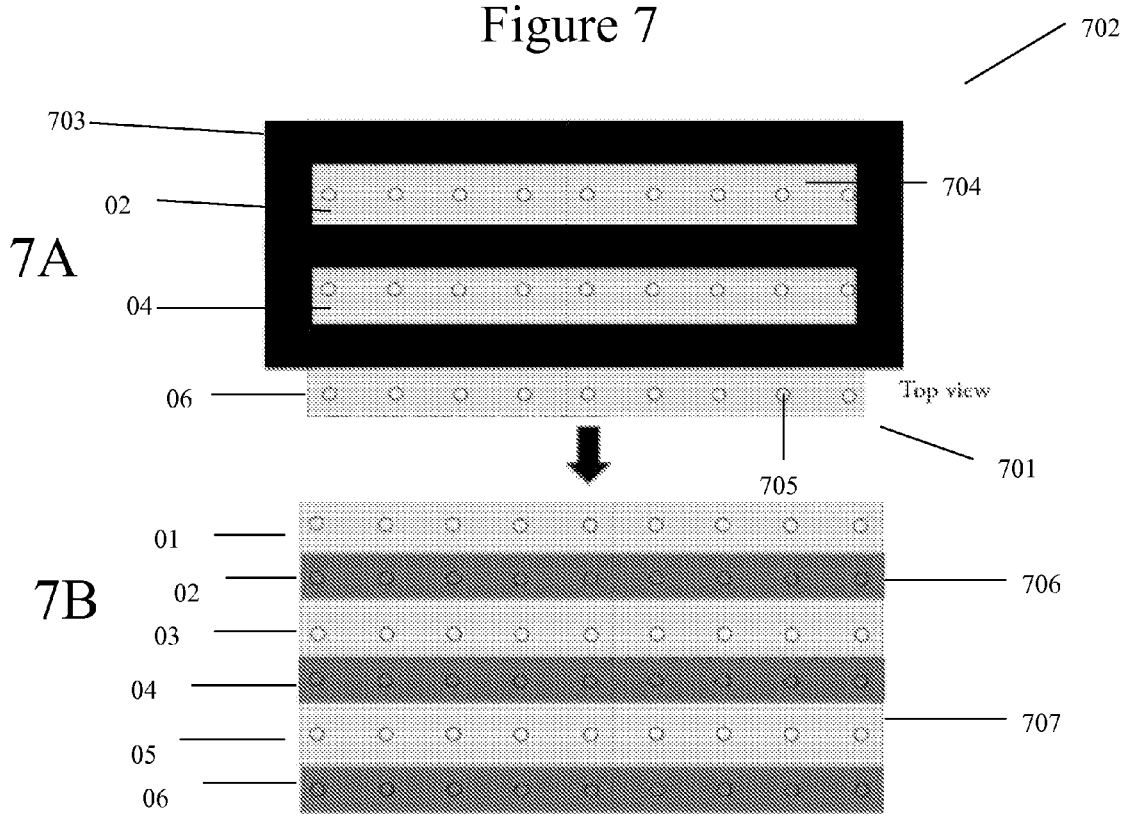
FIG. 7A is a top view of a schematic illustration of a process using a mask for producing replicas of high aspect ratio nanostructures made of different materials.
FIG. 7B is a top view of a nanostructure prepared using the mask of FIG. 7A according to one or more embodiments.

In some embodiments, the replica of the high aspect ratio nanostructures have different materials in different areas of the replica. In some embodiments, a blocking media is used in the process of replication. In certain embodiments, the blocking media is a mask. In certain embodiments, the mask contains areas with different opacities regarding certain radiations. Hybrid nanoposts having nanofeatures of different composition can be obtained using a mask. An exemplary replication process is shown in FIG. 7. As illustrated in FIG. 7A from a top view, a patterned mask 702 is positioned in sealing contact with the top of the negative replica 701. Negative replica 701 has six rows, rows 01-06, each row including recess features such as 705. In FIG. 7A, rows 01, 03 and 05 are covered by mask 702. Mask 702 is patterned to include open regions 704 that provide access to the negative replica recess features 701 and closed regions 703 that block access to the underlying recess areas. During the replication process, a material 706 is applied onto the negative replica 701 which is covered by the mask 702. Deposition can be any of the methods described herein or otherwise used to deposit materials. Specifically as shown in FIG. 7B, rows 01, 03, and 05 of negative replica 701 are covered by the closed regions of the mask, e.g., 703. In comparison, rows 02, 04, and 06 receive deposited material through open regions, e.g., 704, and as a result, complimentary replicas, made of material 706, of recessed features 705 in rows 02, 04, and 06 of 701 are formed. After this first deposition, the recess feature 705 of rows 01, 03, and 05 are still unfilled and a different material, e.g., 707, is applied onto the negative replica 701 after the mask is removed. Thus, a complimentary replica of the negative replica could be formed as shown in FIG. 7B, where rows 01, 03, and 05 are complementarily replicated using material 707 and rows 02, 04, and 06 are complimentarily replicated using material 706.

In one or more embodiments, only the recessed features are filled during a deposition step. In other embodiments, both the recessed features and the backing are deposited from the same material. In still other embodiments, a first material is deposited to fill a first group of recessed elements in a first masking and deposition operation and a second material is deposited to fill a second group of recessed elements in a second masking and deposition operation. A third deposition step is used to deposit a backing layer that can be made of a material that is the same as or different than the first or second materials. Any materials or methods as described above could be used in this process to create the complimentary replica of the negative replica using more than one types of materials. The two materials used as illustrated in FIG. 7 could have different surface chemistry, stiffness, or mechanics. Thus, different areas of the resulting nanostructure replica could have different properties. Nanostructures involving more than two materials and more than two regions are also contemplated.

Figure 23:
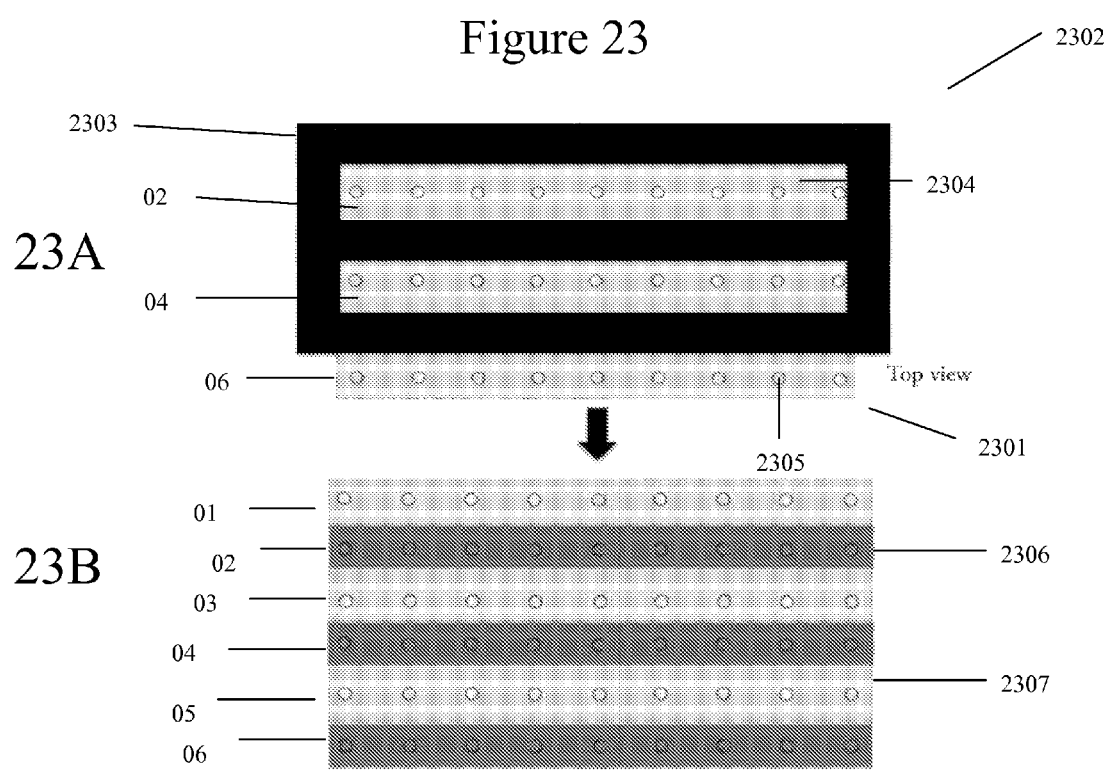
FIG. 23A is a top view of a schematic illustration of a process using a mask for producing replicas of high aspect ratio nanostructures made of different materials.
FIG. 23B is a top view of a nanostructure prepared using the mask of FIG. 23A according to one or more embodiments.

In other embodiments, curable polymers are used to form the replica of the nanostructures. For example, as shown in FIG. 23, a prepolymer is deposited onto all of the rows of the negative replica 2301 having recesses 2305 before the replica 2301 is covered by a mask 2302. In this case the mask can be made of opaque regions 2303 and transparent regions 2304. A curing agent such as a UV radiation is then applied onto the negative replica 2301 covered by mask 2302. The prepolymer which is applied on rows 02, 04, and 06 received radiation through the transparent regions 2304, and are cured. Thus, complimentary replicas of nanostructures in rows 02, 04, and 06 made of polymer 2306 are formed. In comparison, prepolymer applied on rows 01, 03, and 05 are blocked by opaque region 2303 of the mask from UV radiation and thus are not cured. The mask can be repositioned to expose the uncured prepolymer to radiation which can be at a different dose than was used to cure the first rows of prepolymer, resulting in a second region with different properties. Alternatively, uncured polymer in those rows can be washed away and another type of material, e.g., 2307, can be applied onto those rows to form complimentary replicas of the nanostructures of rows 01, 03, and 05. Any material or method as described above could be used to form a complimentary replica of 2301 which is made of two types of material, i.e., 2306 and 2307. Thus, nanostructure replicas where different areas of the replica having different properties could be constructed.

Figure 24:
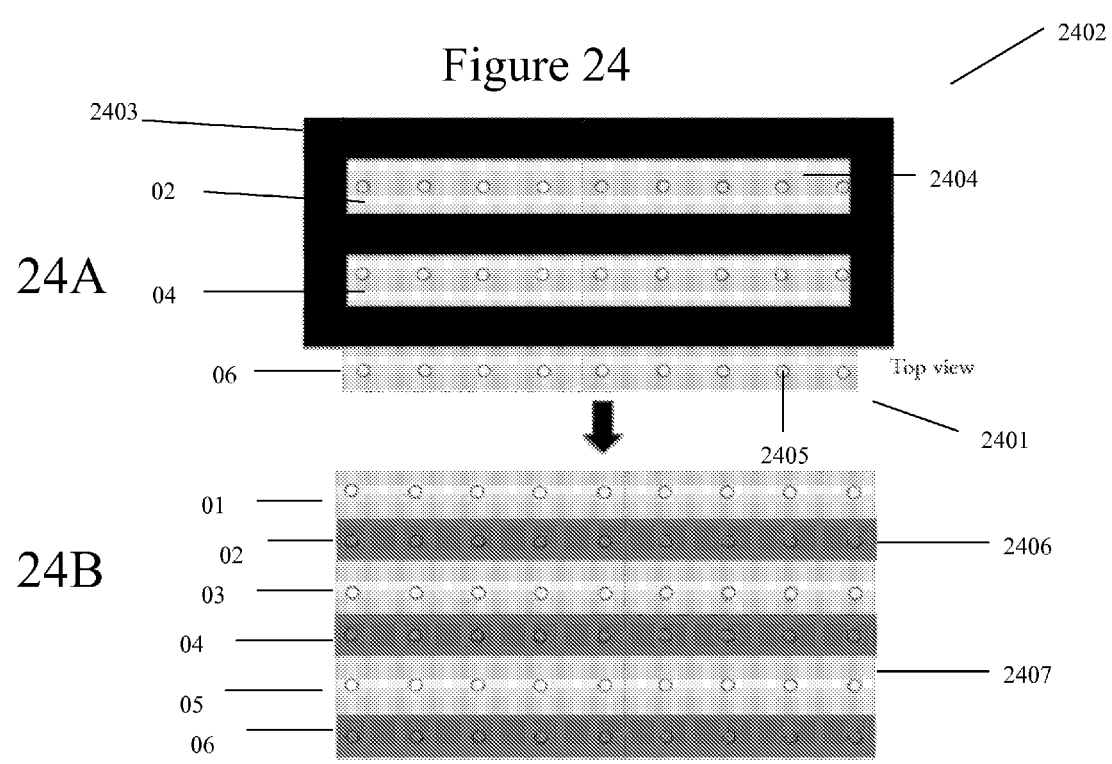
FIG. 24A is a top view of a schematic illustration of a process using a mask for producing replicas of high aspect ratio nanostructures made of different materials.
FIG. 24B is a top view of a nanostructure prepared using the mask of FIG. 24A according to one or more embodiments.

In yet other embodiments, a material that changes properties as a function of the dose of the curing agent, e.g., UV radiation, is used for the construction of the replica of the nanostructures. As shown in FIG. 24, a prepolymer is first applied onto all the rows of negative replica 2401 having recesses 2405 and 2401 is then covered with mask 2402 before a UV dose, is applied. Mask 2402 includes regions such as 2403 as indicated in FIG. 24 which allow less dose of radiation to pass through. In comparison, regions such as 2404 of the mask allow more radiation to pass through during the curing process. Because the prepolymer in rows 01, 03, and 05 are exposed to less dose of the UV radiation than the prepolymer in rows 02, 04, and 06, the resulting two polymers in those rows, i.e., polymer 2406 and 2407 would have different properties. For example, region 2403 of the mask could allow less dosage, i.e., 5%-25%, of the radiation to pass through. In comparison, region 2404 would allow more dosage, i.e., 70-100%, of the radiation to pass through. This would allow a one step patterning and replication procedure.

In other embodiments, a first dosage of a radiation could be applied though a first mask to a first exposed region for a first amount of time. Then, the first mask could be removed and a second mask could be applied which will expose a second region of the negative replica which was not exposed by the first mask. A second dosage of the radiation could be applied to the second region for a second amount of time. Thus, the first and second regions are exposed to different dosages of radiation for different amounts of time. The resulting nanostructures in the first and second regions will have different properties.

By the methods described above, replicas of nanostructures having different properties in different areas could be constructed. Different areas of the replicas could have different stiffness, different surface chemistry or any other physical properties. Some specific examples of deposition methods and deposition materials with different properties are:

i). forming areas of an array of nanostructures with different surface chemistry. When a mask is used during deposition, different surface chemistries could be obtained in different patterned areas. In some embodiments, the entire array could be functionalized with a molecule that exhibits a specific chemical characteristic and then the array could be exposed to intense UV radiation through a mask. The areas that are irradiated could lose the surface functionalization. The areas of nanostructures without any chemical functionalization could then be exposed to a different molecule that exhibits a different chemical characteristic, thus resulting in an array of nanostructures with identical geometry but with patterned areas of different surface chemistries. Non-limiting examples of chemical characteristics include hydrophobicity. In some, embodiments, an array of nanostructures including areas that are hydrophilic and areas which are hydrophobic. Non-limiting examples of the chemicals used to induce different nanostructure surface chemistry include differently functionalized thiols or silanes that bind to the surface of the array.

ii). patterned areas with different materials. In some embodiments, a material is introduced into the negative mold and could then be cured through a mask. In some embodiments, the material is a prepolymer and the prepolymer could be cured by the application of a radiation. The areas that receive irradiation would cure and the remaining uncured prepolymer could be washed off and the negative mold could be filled with a second material. After the second material is cured, an array of nanostructures could be formed and different areas of the array could be constructed by different materials. These different materials can have a plurality of different properties. Non-limiting examples of properties include elastic, electrical, magnetic, dielectric, or optical properties. In other embodiments, a material that could display a range of properties as a function of the irradiation received is used. For example, during the formation of certain polymers, the degree of cross-linking in polymerization could be determined by the amount of radiation applied. The degree of cross-linking would determine the mechanical properties of the polymer. Thus, when a mask that has patterned regions with different degrees of irradiation transmissivities is used during the fabrication of the replica nanostructure, nanostructures having different properties in different areas could be obtained.

iii). the fabrication methods in i) and ii) could be combined. For example, the patterned array could be fabricated by combining materials properties as well as surface chemistry and in addition several orders of pattern hierarchy could be used.

Non-limiting examples of materials that can be used to construct the nanoposts include polymers such as epoxy, polystyrene, polyurethane, polyethylene, ceramics such as alumina, MgO, ZnO, silica, hafnia; and metals such as coinage metals and tungsten. Non-limiting examples of materials that can be used to construct the backings of the nanoposts include polymers such as epoxy, polystyrene, polyurethane, polyethylene, ceramics such as alumina, MgO, ZnO, silica, hafnia and metals such as coinage metals and tungsten.

Controlling Nanostructure Geometry with Deformable Molds

In addition to providing multiple one-to-one replicas of a nanostructured surface, flexible replica molds can be used to provide a wide range of nanostructures from a single mold. The structures can be used as actuators, hydrophobic surfaces, flow sensors, low-drag pipes, fillers in composite materials and superadhesive, as is discussed more fully herein below. A flexible mold deforms readily on application of a force or stress, but is capable of returning substantially to its original form upon release of the applied force. Elastic materials may be used for such molds, and stiffness, or the resistance of an elastic body to deflection or deformation by an applied force, may be a measure of suitability. In one or more embodiments, the mold is prepared of a material with a high modulus of elasticity and/or low stiffness. Suitable material properties are selected based on the anticipated use of the mold, i.e., the extent of deformation or flexibility that is required during the molding process. Exemplary stiffness can range from about 1 MPa to about 10 GPa. High flexibility of the mold also makes it easier to peel the mold off the replica and/or original substrate, thus reducing the risk of breaking or damaging the original or the replicated nanostructures.

PDMS is a silicone-based elastomer with a low stiffness (about 1 MPa). PDMS is an elastomer and can be deformed to over 300% in dimension without breakage and without residual deformation. Other elastomer polymers include butyl rubber, Polybutadiene (BR), Nitrile Rubber, Silicone rubber and Thermoplastic Polyurethane (TPU).

In one or more embodiments, a negative replica made of PDMS or other flexible material is mechanically deformed, thus forming negative replicas and end product replicas that have different geometries from the original structures. The varying geometries are obtained by deforming the flexible mold during the process of forming the replica. These deformations can enable fabrication of varying 2D geometries of an array of posts as well as of individual posts themselves. They also enable the fabrication of varying 3D geometries and make new 3D structures that cannot be made by traditional lithography. Examples of replica nanostructure parameters that can be controlled include size, pitch, symmetry, tilt and twist.

The deformation molding is illustrated using a negative replica for a 2D array of posts, e.g., having a pitch range from about 0.5 microns to 14 microns, a height range of about 2-10 microns, and a post diameter range of about 100 nm to 1 micron. This is or the purposes of illustration only. Other geometries and feature sizes can be used. According to one or more embodiments, a deformation force is applied to a flexible negative mold in order to alter a feature of the mold. The deformed mold is then cast with the suitable replica material as discussed herein above. Once mold is complete, the deformation forces can be removed and the replica mold is removed.

Figure 8:
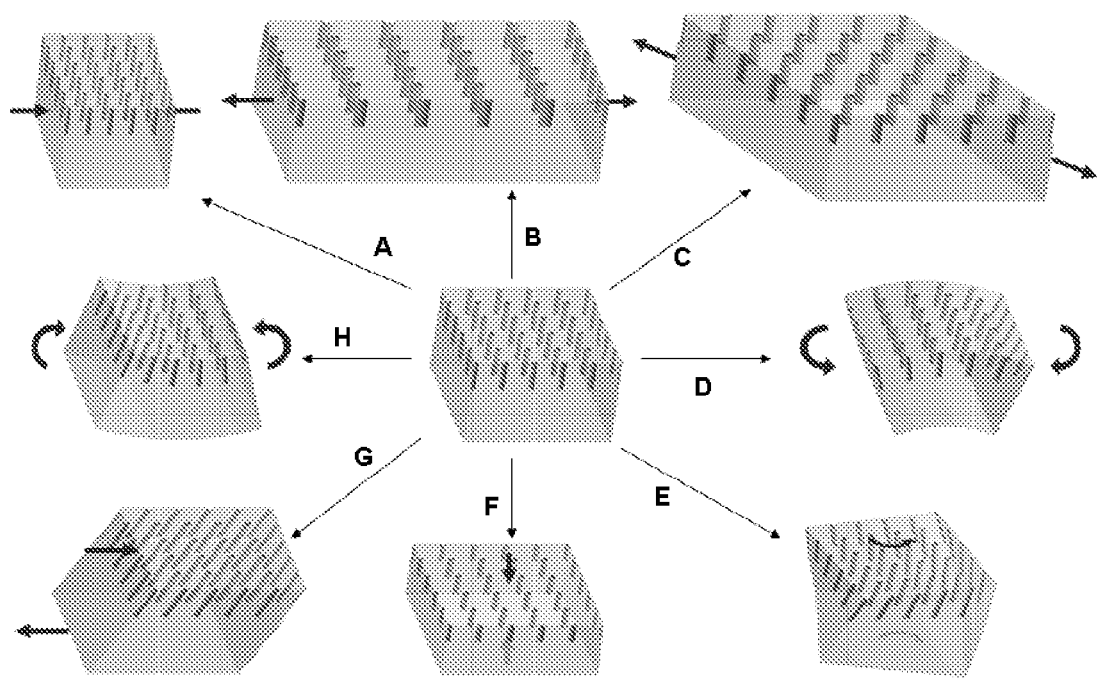
FIG. 8 is a schematic illustration of exemplary deformation types that can be applied to a nanostructure article according to one or more embodiments.

Certain exemplary deformation types are shown in FIG. 8 and the resulting changes in geometry are summarized in Table 1. By deforming the PDMS negative molds via stretching or compression in the principal directions of the 2D array of posts, the original 2D square lattice can be transformed to a rectangular (FIGS. 8A and 8B) or rhombic (FIG. 8C) lattice and the original circular cross-sections of the nanoposts to elliptical (Table 1, columns 2 and 3). By deforming the mold in the general [hk0] direction, a parallelogram unit cell with finely-tuned parameters can be formed. See, FIG. 8C and Table 1, column 3. The amount of the deformation determines both the degree of ellipticity and the unit cell of the nanoarray. Tilted structures can be formed by applying a shear deformation to the mold. See, FIG. 8G and Table 1, column 4. The amount of the shear determines the tilt angle, and the direction of the shear determines the tilt direction. The length of the posts, $l_0$, can be changed by compressing the negative mold perpendicular to the 2D array (Table 1, FIG. 8F). One also has the ability to form twisted nanostructures (FIG. 8E) or curved surfaces with different radii of curvature (concave or convex) (FIG. 8D, 8H). To ensure the fabrication of an arbitrary array of nanostructures, any combination of the deformation types can be applied. Various deformation types and their affect on the resultant nanostructures are shown in Table 1. Combinations of deformations can be obtained by applying two or more deformation types to the flexible mold.

TABLE 1

| Parameter | No deformation | Stretching/compressing along [100] | Stretching/compressing [110] | Shearing along [100] | Compression along [001] |
|---|---|---|---|---|---|
| a | $a_0$ | $1/3 a_0 < a < 3 a_0$ | $a_0 < a < 2.1 a_0$ | $a = a_0$ | $a \cong a_0$ |
| b | $b_0 = a_0$ | $3 a_0 > b > 1/3 a_0$ | $b = a$ | $b = a_0$ | $b = a$ |
| θ 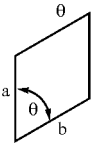 | $\theta_0 = 90°$ | $\theta = \theta_0$ | $12.5° < \theta < 167.5°$ | $\theta = \theta_0$ | $\theta = \theta_0$ |
| Tilt (t) 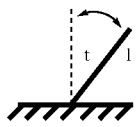 | $t_0 = 0$ | $t = t_0$ | $t = t_0$ | $0 < t < 63.4°$ | $t = t_0$ |
| Post lengths (l) | $l_0$ | $l \cong l_0$ | $l \cong l_0$ | $l_0 < l \le \sqrt{5} l_0$ | $1/3 l_0 < l < l_0$ |
| Cross section 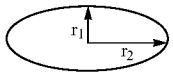 | $r_1 = r_2 = r_0$ | $r_1 < r_2$ | $r_1 < r_2$ | $r_1 = r_2 = r_0$ | $r_1 = r_2 > r_0$ |
| 2D array symmetry | square  | rectangular 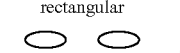 | rhombic 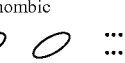 | square  | square  |

The 2D symmetry of an array can be distorted to produce an asymmetric array having different pitches or spacings in the x direction and the y direction. In one or more embodiments, the mold is deformed along a single desired vector F using either tensile or compressive deformation. For example, when F is a tensile force F, the mold is deformed from a first shape to a second shape and the features on the mold surface are correspondingly also deformed, so that the spacing between rows will increase in the y direction and decrease in the x-direction. Alternatively, when F is a compressive force, the mold is deformed, so that the spacing between rows will decrease in the y direction and increase in the x-direction. Tensile and compressive forces can be applied in any direction, e.g., any combination of x- and y. In one or more embodiments, stretching is accomplished by clamping two opposite sides of the negative mold, and stretching and fixing the clamped ends while the curing takes place. Compression of the mold can be performed using a device such as a vice. Other means of compressing and/or stretching the mold may be employed.

Figure 9A:
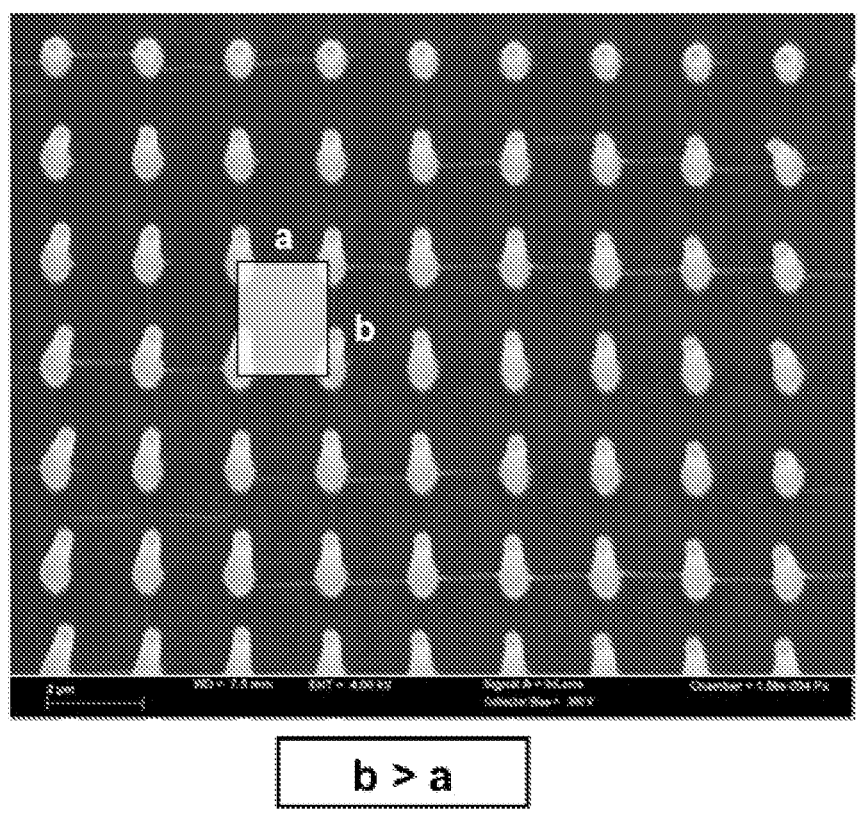
FIG. 9A is a scanning photomicrograph of a 2D nanopost array that has been cast from a negative mold subjected to tensile deformation.

For an initial cubic 2D array, deformations can produce an array of posts having rectangular (x- or y-deformation only), rhombic (deformation along a diagonal) symmetry. If the deformation is performed along one of the principle lattice directions, the cubic lattice is transformed into an orthorhombic lattice. FIG. 9A is a photomicrograph of a 2D array of nanoposts that has been subjected to tensile deformation. The uniform spacing between rows and columns in the original negative replica is distorted in the resultant replica. As is indicated in FIG. 9A, the spacing between rows b is greater than the spacing between columns a. If the deformation is along the diagonal it is possible to obtain a rhombic lattice. If the deformation is along any other direction (deformation using a deformation having and x- and y-vector), the result is a parallelogram lattice. The spacing between the posts can also be altered. In one or more embodiments, the mold is deformed along two desired vectors that coincide with the main 2D lattice parameters; the replica maintains the original symmetry but alters the pitch and the size of the posts. The deformation can be tensile or compressive.

Figure 9B:
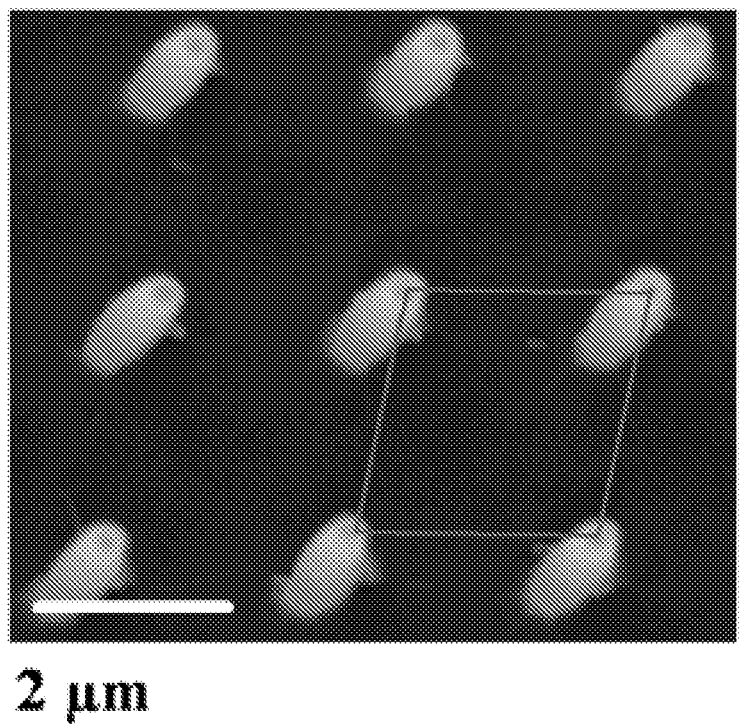
FIG. 9B is a scanning photomicrograph of an epoxy nanostructure surface that was subjected to a compound deformation force of stretching and shear in the [110] direction.

FIG. 9B shows an example of an epoxy nanostructured surface that was fabricated using a compound deformation of the mold consisting of a square array of normally-oriented, 8 μm-deep, circular wells with $a_0$=2 μm and $r_0$=125 nm. By applying a 20% stretch and 12.5% shear in the [110] direction, a structure that exhibits tilted nanoposts with t≅7°, θ≅78° and a≅2.18 μm was generated.

In addition to changing the spacing between posts, asymmetric deformations also change the shape of the cross-section of the posts. In one or more embodiment, the deformation is asymmetric (anisotropic deformation of any kind); the cross sections of the posts will also be deformed asymmetrically and will change to elliptical from circular, or rectangular from square. All the above deformations can be made within the elastic range of the elastomer, which permits up to about 300% deformation.

Figure 10:
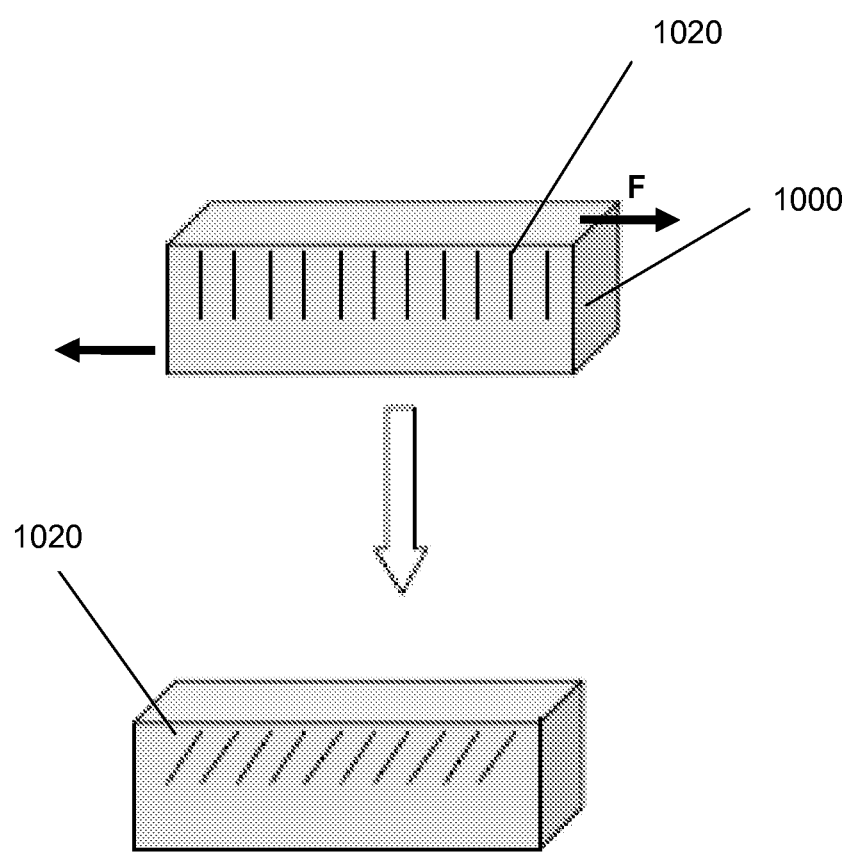
FIG. 10 is a schematic illustration of mold demonstrating application of shear to a negative replica mold.

In one or more embodiments, the mold may be deformed by applying a shear force to the mold. A shear force arises when the force along the upper face of the negative replica mold 1000 is different from the force applied to the lower face of the of the mold 1000. This is illustrated in FIG. 10. In one or more embodiments, a shear deformation of the upper part of the mold 1000 is applied and the lower part of the mold is fixed in place. Alternatively, the lower part of the mold 1000 is subjected to a force in the opposite direction from the upper portion of the mold 1000. Applying a shear deformation results in tilting of the posts 1020, as is illustrated in FIG. 10. The choice of the shear vector determines the relative direction and extent of tilt up to a maximum of 63.4°.

Figure 11:
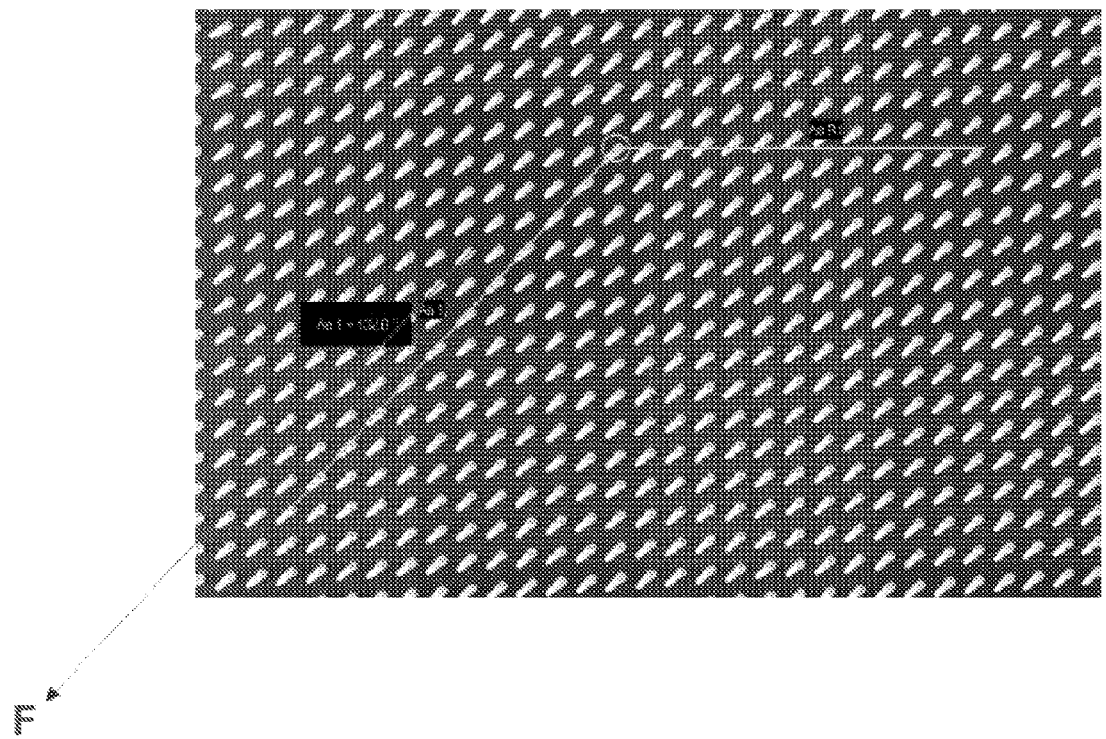
FIG. 11 is a photomicrograph of a nanopost structure including tilted posts made from a sheared replica mold.

An example of a tilted array is shown in FIG. 11. In order to generate this microstructure, force is applied along the upper surface of the negative replica mold along the diagonal direction of vector F and the base is anchored in place. The mold is cast, for example, with a polymer to obtain a nanostructure in which the nanoposts are tilted from perpendicular relative to the base, in the direction of the applied force. This is a structure that would be very difficult to obtain using normal lithographic techniques, yet it is obtained simple, rapidly and repeatedly using a flexible negative replica mold according to one or more embodiments. Suitable tilt ranges are found in Table 1.

Figure 12:
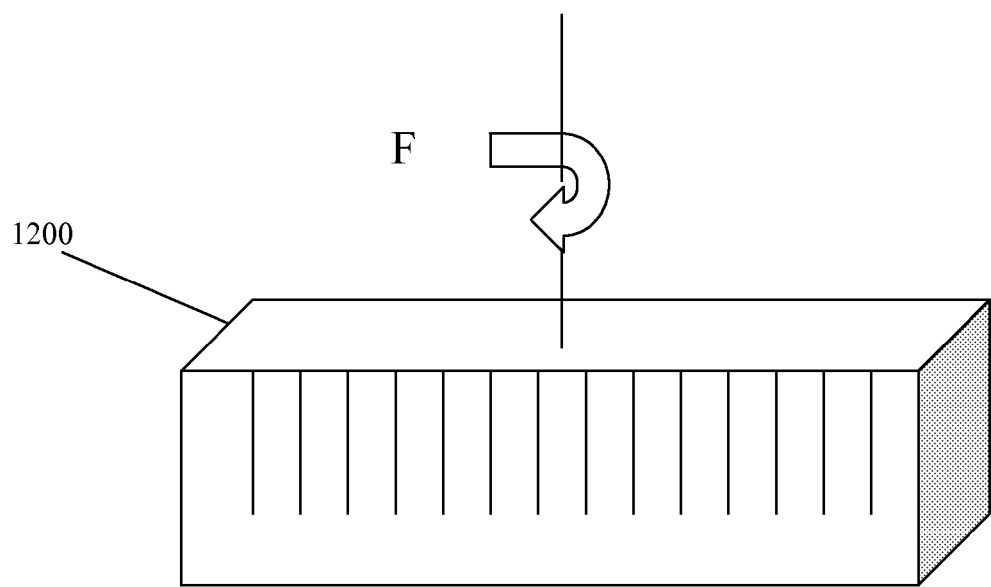
FIG. 12 is a schematic illustration of mold demonstrating application of torsional shear to a negative replica mold.

In still other embodiments, spirally oriented nanoposts can be obtained by applying an angular shear deformation of the upper part of the mold as compared to the lower part of the mold produces a twisting of the mold. The deformation forces are illustrated in FIG. 12, in which the arrow designates a rotational force being applied to the upper surface of the mold 1200. A twisted mold can form posts that are spiral in shape.

Figure 13A:
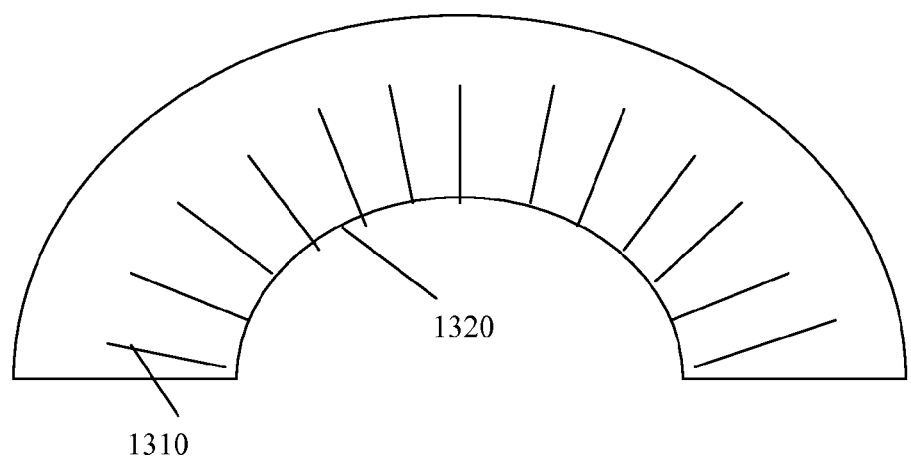
FIG. 13A is a schematic illustration of a negative replica mold that has been bent to conform to a concave surface.
Figure 13B:
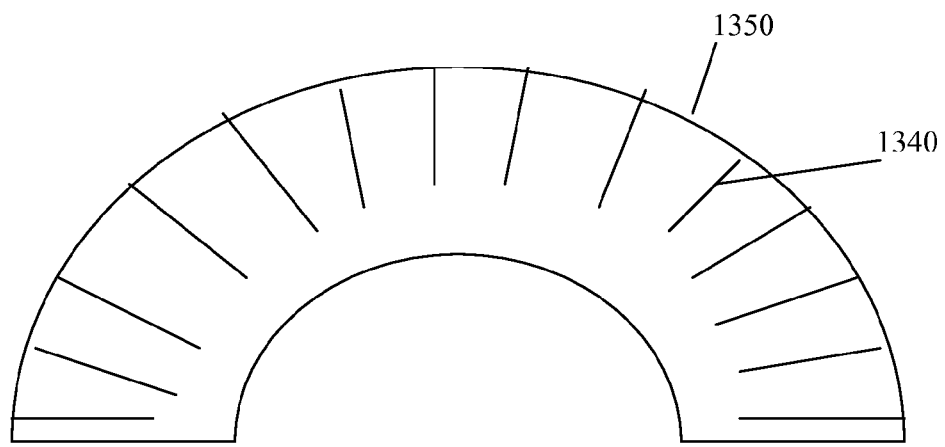
FIG. 13B is a schematic illustration of a negative replica mold that has been bent to conform to a convex surface.

The nanostructures described above are formed on flat substrates. Bending of the flexible negative mold permits the formation of replicas that have convex and concave curved shapes. In general, the thinner the mold, the more the mold can be bent, and the greater the curvature of the resulting replica surface. Using a very thin negative replica, the negative replica mold can have enough flexibility to wrap around a curved surface. In one or more embodiments, the mold can conform to a convex surface 1320, with nano-posts 1310 impeded, as illustrated in FIG. 13A. In one or more embodiments, the mold can conform to a concave surface 1350, with nano-posts 1340 impeded, as illustrated in FIG. 13B. In still other embodiments, the mold can be wrapped or bent so as to form a cylinder. Alternatively, in the case that one produces a surface with stiff rods and soft backing one can be curved the surface to make a pipe.

Among the deformations described above, the planar asymmetrical, and the pitch and size deformations could, in principle, be produced using lithographic techniques, since the structures of the third dimension are perpendicular to the plane of the substrate. However, the traditional lithography approach requires a separate mask and a separate etching process for each structure, making the procedure extremely expensive. By contrast, a single deformable mold, as described here, can produce a range of geometries at much lower cost. Moreover, the shear, twisted, and curved surface deformations cannot be produced at all by lithography since the structures in the third dimension are not perpendicular to the substrate.

A single mold can be deformed in a variety of different ways, and can be used to make a variety of different structures. One or more deformation strains may be applied at the same time. For example, a negative mold can be subjected to both compressive and torsional strain at the same time.

In some embodiments, the mold is deformed before the replica nanostructure material is poured into or deposited into the mold. In other embodiments, the mold is filled with the liquid precursor of the replica material, and then the filled mold is deformed.

Chiral Assembly

Additional 3D features can be introduced into the nanostructures after the nanostructure article has been formed. Nanostructures of even greater complexity can thereby be obtained by controllably altering the relationship of neighboring nanofeatures. When engineering a functional surface bearing high-aspect-ratio nanoposts, one should consider the stability of the expected structures. There are several factors that can lead to the collapse of nanoposts: a collapse due to the self-weight; adhesion forces between the posts and the base surface; and lateral adhesion. The first two factors are small and not expected to exert a significant force on the nanostructures structures; however, the importance of the second factor increases with the fabrication of the tilted nano structures. The lateral adhesion force is the strongest of the three. The critical aspect ratio, below which there will be no lateral collapse, is given by $$\frac{l}{d} = \left( \frac{0.57 E^{1/3} a^{1/2}}{\gamma_s^{1/3} d^{1/6} (1-v^2)^{1/12}} \right) \quad (1)$$

where d is the diameter of the posts, $\gamma_s$ is the surface energy and v is the Poisson ratio of the nanostructured material and a is the pitch.

Small and specific forces can be exerted to the nanostructure features using fluidic surface tension forces to add further levels of morphological complexity to the structures. For example, adjacent nanoposts can interact and 'cluster' in predictable and reproducible ways. The surface tension of the liquid and the Young's modulus and geometry of the nanowire array are regulated and balanced in such a way that the force applied by the liquid will induce bending and clustering of the nanowires into groups. The number and pattern of the grouped nanowires can be controlled by tuning the geometry of the nanowire and the Youngs modulus of the nanowire material.

The liquid drop has a surface energy due to its surface tension, given by $G_d = \gamma S$ where S is its surface area. It is assumed that the drop is so small that gravitational effects are negligible compared to the surface tension. In the absence of any other forces, the drop will tend to minimize its surface energy and hence its surface area, i.e. its preferred shape is a sphere. When the liquid droplet spans two (or more) nanoposts, the effect of the pulling force of the nanopost is to deform the drop by elongating it in the axis between the two nanoposts. This deformation gives rise to a restoring force as the surface tension of the drop strives to keep its shape as close to a sphere as possible. The restoring force brings the nanoposts into close proximity to one another and attractive forces, e.g., van der Waals, electrostatic forces, etc., between the nanoposts assist in forming stable clusters.

In one or more embodiments, a nanostructure array made of a flexible polymeric substrates is exposed to a liquid. As the liquid dries, surface tension exerts forces between nearby posts, causing them to bend and cluster in a controlled manner. These clusters form unique self-assembled large-area structures that are impossible to make by any other technique. The size and shape of the clusters are determined by pitch of the array, the heights of nanoposts, and the flexibility of the polymeric substrate.

Figure 15A:
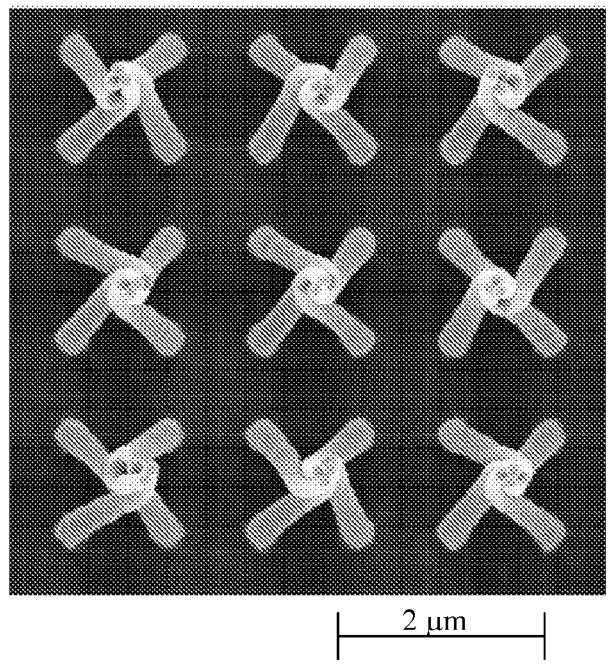
FIG. 15A is a photomicrograph of a nanopost structure including assembly of regular repeating 4 nanoposts chiral clusters according to one or more embodiment.
Figure 15B:
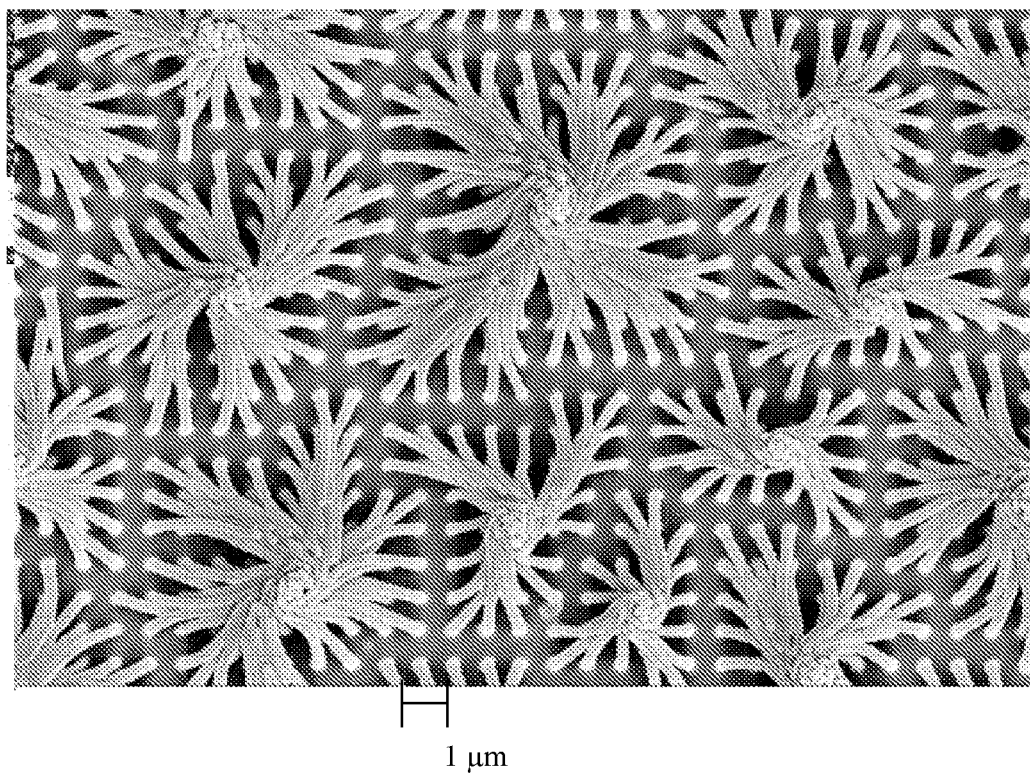
FIG. 15B is a photomicrograph of a nanopost structure including an assembly of multi-nanoposts chiral clusters having about 20-60 nanoposts per cluster according to one or more embodiment.

FIG. 15A shows an array having a 4 micron pitch. Exposure of the nanoposts to liquid caused the rods to cluster in groups of four, forming a chiral structure. FIG. 15A is a photomicrograph series of tetramer clusters, assembled into near perfect arrays. Nanostructure parameters can affect the nature and extent of clustering. FIG. 15B is a photomicrograph of a 1 micron pitch array made from the same epoxy material (with a modulus of 1 GPa) as the array in FIG. 15A. The difference between FIGS. 15A and 15B is the length of the nanostructures: 5 micron tall in FIG. 15A and 8 micron tall in FIG. 15B, with the same diameter of 400 microns and same spacing of 1 micron. The smaller pitch, smaller diameter, longer length lead to softer more flexible materials resulting in the formation of larger clusters of about 20-60 rods or more than 100. The size of the cluster can be controlled by choosing the proper combination of materials and geometric properties.

Figure 15C:
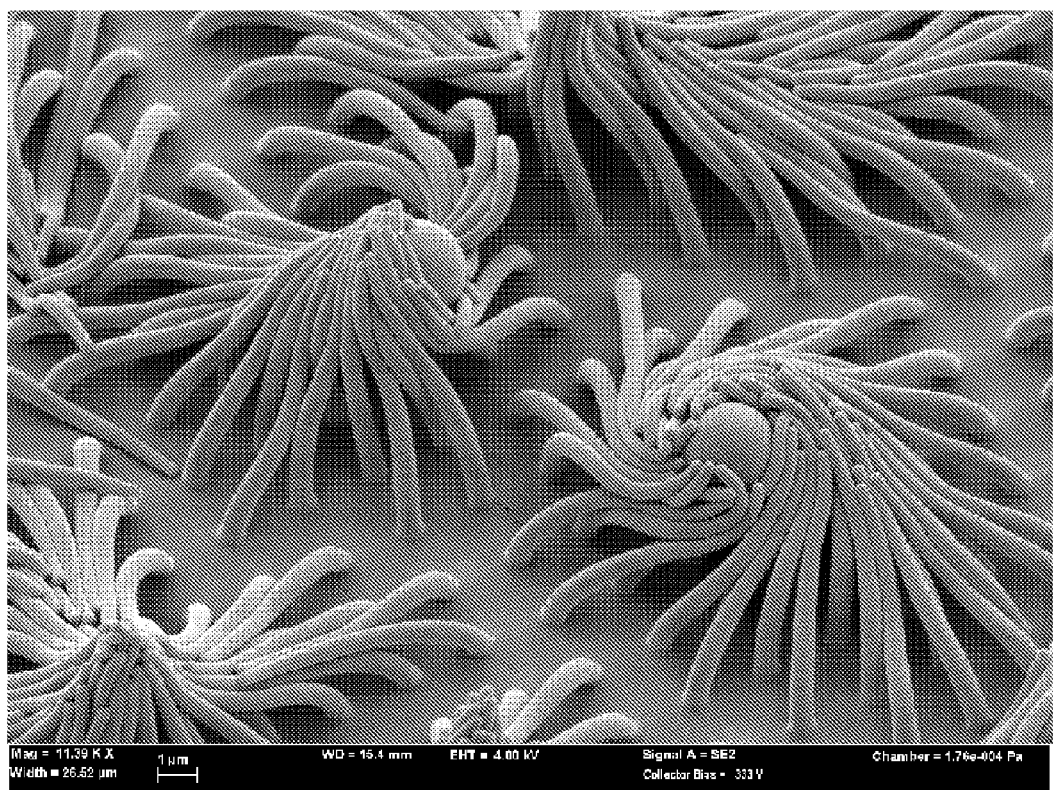
FIG. 15C is a photomicrograph of a nanopost structure used for particle trapping.

Clustering can also be used for an effective particle trapping and release, as shown in FIG. 15C. A variety of particles can be trapped by using nano clusters. The surface of the nanostructures could be inherently or chemically modified to be sticky, thus allowing effective trapping of the particles. Once trapped, the particles could also be released by using a variety of media such as solvents.

Figure 16:
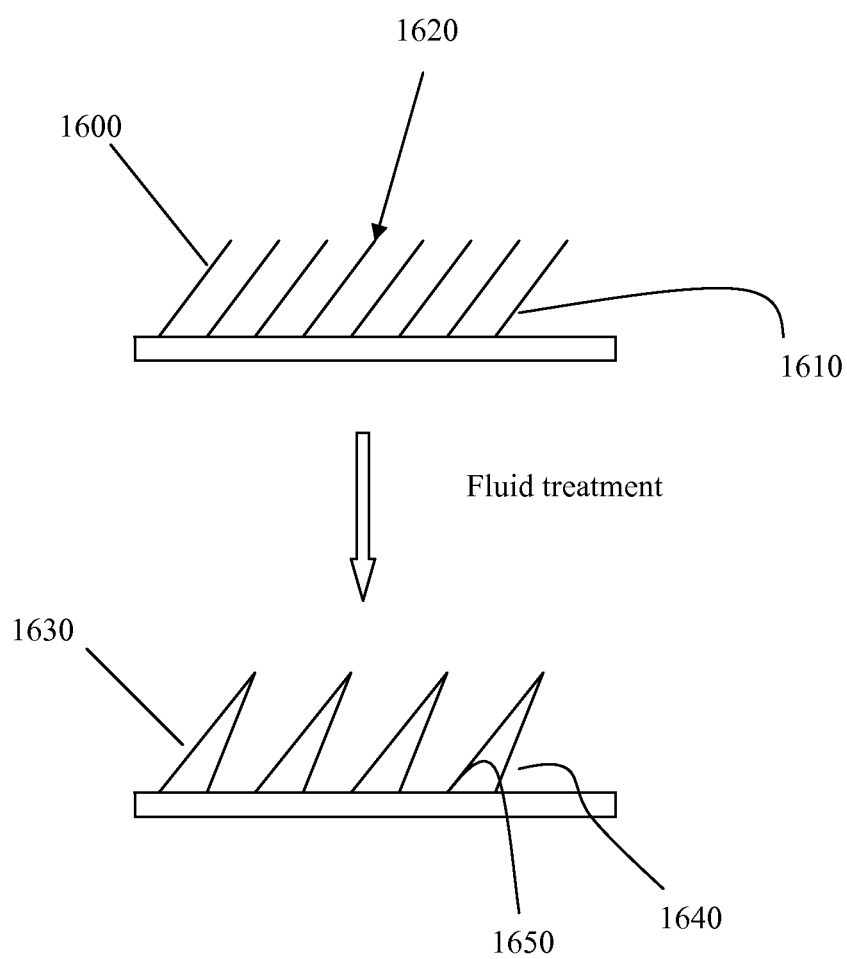
FIG. 16 is a schematic illustration of a cluster formed using tilted nanoposts.

Clustering is not limited to perpendicular nanopost arrays. For certain arrays of tilted rods, the effect of exposure to liquid is to cause pairs of rods to attract each other, causing a first rod to be pulled up towards a perpendicular position, and a second rod to be tilted even further in the direction of the first rod. FIG. 16 is a schematic illustration of a cluster formed using tilted nanoposts. FIG. 16A shows a regular array of nanoposts 1620 including multiple individual nanopost 1600 tilted at an angle 1610 (relative to the article surface). The surface of the array is exposed to a fluid, such as water, which is allowed to dry. As it dried the attractive force draws the posts closer together (FIG. 16B). The clustered nanoposts 1630 now vary in their tilt angle with respect to the surface, so that some of the posts are at an angle 1640 which is greater than 1610 and others, e.g., 1650, are less than 1610.

As noted above, hybrid nanostructures can be prepared in which the properties and materials of the nanoposts and base are different. In those instances where clustering is to be avoided, nanoposts can be made of materials having sufficient stiffness to provide rigid posts that do not bend or deform readily.

Applications

Various applications of the nanostructure materials prepared according to one or more embodiments are described. The applications for such nanostructure articles are many and varied and include actuators, templates for cell growth, surfaces for biofouling reduction, particle trapping or particle transport, tunable waveguides, anisotropic drag reduction, and adhesives. Various applications involve structures that are responsive to stimuli in the form of magnetic fields, electrical fields, temperature, piezoelectricity, or acoustic signals.

Composite Reinforcement

Figure 14:
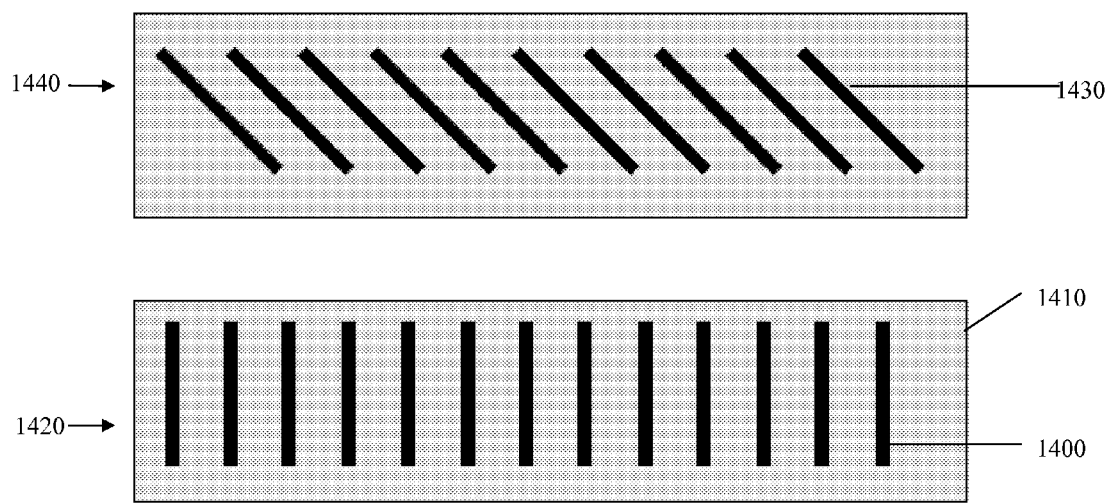
FIG. 14 is a schematic illustration of a composite material with embedded nanoposts.

The nanoposts can be used as stiffening filaments in thin-film composite materials. In some embodiments, a composite material is made by spin coating a material on the nanoposts to the desired thickness and then breaking the posts off the substrate. Various materials having varying values of Young's modulus could be used. In addition, by using tilted posts, composite materials with directional mechanical properties can be made. FIG. 14 is a schematic illustration of composite materials 1420 and 1440 with embedded nanoposts 1400 and 1430, respectively. The composite material, e.g., 1420, can be in the form of a thin film 1410.

Actuation

The mechanism of movement of the nanoposts guides the design of functional nanostructures for applications in activation and sensing. In one or more embodiments, actuators are formed by depositing an actuating material onto the structure that causes the desired motion. In one or more embodiments, actuation may be accomplished by using an intrinsic property of the replica material itself, such as shape memory or magnetic properties.

By combining actuation of the posts and deformation of the 2D lattice the direction of actuation of the posts can be controlled. For example, anisotropically deforming the posts by anisotropic stretching changes the post cross section from circular to elliptical; this means that the posts will actuate more easily in the direction in which the dimension is smaller.

In one or more embodiments, an actuator includes one or more replicated nanostructures and a polymer substantially surrounding a portion of the nanostructures. The polymer layer is placed within and around replicated nanostructures, and can exert a mechanical force on the walls of the posts at a base area where the posts meet the substrate, to cause bending or collapse. The polymer may surround the nanoposts at a base of the nanoposts. By way of example, the replicated nanostructure can be a rigid rod, such as a ceramic nanopost.

The nanostructure/polymer actuator can be made in a variety of ways. In one approach, the polymer layer is infiltrated into the substrate surface by spin coating. In an alternative method, a film of polymer is spread on a second, flat substrate, and the tips of the posts are embedded into the polymer by placing the polymer-coated substrate onto the tips of the array of posts. After embedding the tips of the posts, the posts are broken from the original substrate near their bases by shear, to produce a tensegrity-type structure of free-standing posts embedded in a polymer layer. The polymer surrounding the base of the posts acts as a kind of muscle for the posts and can be actuated by a variety of different stimuli, including temperature, magnetic, acoustic, or electric.

Temperature controlled actuation can be used to cause structural deformation of the replicated structures or of the infiltrated polymer layer. In one or more embodiments, the polymer can be a hydrogel that is responsive to various environmental stimuli such as temperature or pH and can undergo phase changes with dramatic changes in volume under appropriate conditions. A hydrogel is a polymer network that contains a high volume of water; the amount of water in the hydrogel can change rapidly with temperature. For example, the polymer can be a LCST (lower critical solution temperature) polymer that increases volume as the temperature is lowered. Non-limiting examples include poly(N-isopropylacrylamide) (PNIPAM). This drastic change in volume leads to the movement of the posts.

Temperature-controlled actuation can also exploit the glass transition temperature of the nanostructures themselves. Below the glass transition temperature, the polymer is stiffer and has a lower heat expansion coefficient than at temperatures above the glass transition temperature. By heating the nanostructures with a heat gradient that spans the glass transition temperature, one can cause thermal expansion that varies across the array, resulting in anisotropic partial collapse or bending of the nanoposts.

In embodiments, a temperature-controlled actuator includes an array of nanoposts and a metal element located on one side of the nanoposts. The actuator uses electrical heating of the metal to selectively heat portions of the actuator. In one or more embodiments, the metal is deposited on one side of the post, preferably on the underside of the substrate below the array of posts. By way of example, conductive metal strips or wires may be applied to the underside of the actuator in predefined areas. Current passing through the metal heats the actuator locally in very small regions of the device. For example, a metal line can be located between two rows of nanoposts in a nanoarray so that one side of each row of nanoposts is closest to the metal line. The electrical heating results in the heating of the polymer on just one side, creating a large expansion mismatch which bends the post. Depending on the gradient of expansion mismatch, the posts can be made to bend either towards or away from the heat source. The metal for the heating elements is deposited in a pattern that allows control of the number of posts that will bend and the direction of bending. By patterning small heat sources on the substrate, small-scale temperature gradients can be achieved that produce corresponding small-scale patterns of actuation among the posts.

Figure 17:
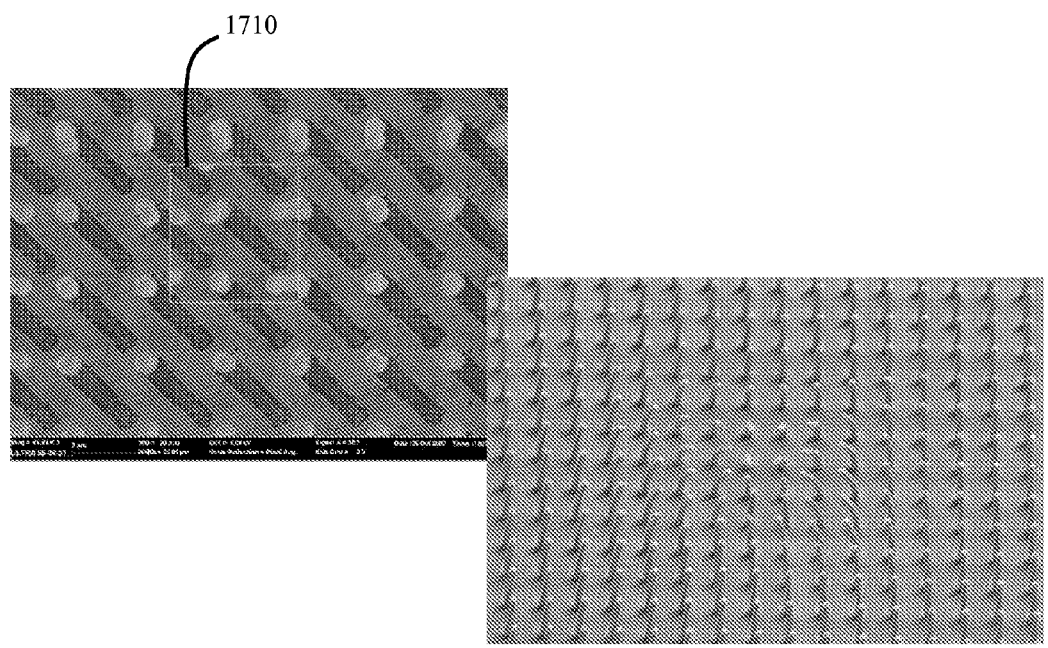
FIG. 17 is a photomicrograph of an actuator including an array of thermally sensitive nanoposts that bend upon heating with an electron beam.

Yet another method of temperature-controlled actuation uses heating by an external source, such as an electron beam or IR irradiation or other focused energy source to create small patterned regions of heating. The patterned heating generates thermal gradients within the nanoposts that cause the posts to bend in a preselected location and in a preselected direction. The posts within the area heated by the electron beam bend, as shown in FIG. 17, where the tips bend towards the center of the heated area 1710. Due to the relatively low forces needed to move the posts in our typical structures, the actuation can be observed under the Scanning Electron Microscope (SEM). In this case, the actuation is probably driven by the electrostatic forces imposed by the e-beam. This movement is reversible and can be repeated multiple times: the posts bend into the e-beam when the beam is focused on a small area, and return to their normal orientation once the e-beam is not concentrated on a small scanning area. This is only an illustration of the ability of these posts to respond in a controlled manner to an external force.

In another embodiment, an actuator may be prepared using replicated nanostructures that are capable of reversible clustering upon wetting and dewetting. The clustering of nanopost arrays is accomplished by wetting/dewetting of the nanopost array and resulting capillary forces. The formation of clusters of posts as shown in FIGS. 15A-B may be used for actuation, forming clusters by wetting and capillary forces and returning to its original configuration upon drying. Similarly, clustering can be used to trap and store particles. The particles can be reversibly trapped and released by changing the nanostructure environment, including different solvents, pH values, temperature, and sonication.

Another actuation method uses magnetic actuation. In this method, the replicated structures are modified with ferromagnetic nanoparticles. For example, polymer replicated structures are impregnated with magnetic nanoparticles during the replication process. Uniform impregnation of the polymer is achieved by providing the particles with appropriate surface chemistry; generally for the case of epoxy, epoxy terminated groups or simply hydrophobic groups are added to the particles. Vigorous sonication of the particles in the polymer precursor also helps to disperse the particles homogenously throughout the polymer. Both soft and hard magnetic materials can be used. A nanopost array made out of such a magnetically impregnated polymer can then be actuated by applying an external tunable magnetic field using one or more electromagnets. In one configuration, a large electromagnet contains the entire sample, and is several centimeters across. In another configuration, the field is provided by small localized electromagnets embedded on the nanopost base.

The nanoparticles are composed of ferromagnetic or superparamagnetic materials, such as, for example, Fe, Ni, Co, $Fe_3O_4$, and NiFe. A layer of magnetic material can be also deposited on top of the nanostructures.

A further actuation method involves setting up acoustic waves in the nanostructure array. A transducer generates surface acoustic waves, which causes oscillation of the replicated nanostructures. Acoustic frequencies that induce resonant vibration of the nano-pillars are chosen; by varying the frequency in a region near a resonant frequency, the intensity of mechanical movement of the posts can be controlled.

The replicated nanostructure can also be actuated electrically; this is achieved by modifying or infiltrating the material used for replication with a piezoelectric material, such as Polyvinylidene Difluoride (PVDF), or an electrically-sensitive polymer hydrogel, such as polypyrrole, or polyaniline. The PVDF is spin-coated between the posts to form a several micron-thick layer having piezoelectric properties. Connecting electrodes to the film and running a current actuates the posts by changing the volume of the PVDF film.

By coating the flexible nanoposts with a piezoelectric material, one can harness electrical current by the movement of the posts. The movement of the posts can be stimulated by external stimuli such as acoustic sound, and vibrations.

Prevention of Biofilm Formation

Surfaces made of hydrophobic materials and having a high degree of surface roughness can have superhydrophobic properties. Superhydrophobic materials have surfaces that are extremely difficult to wet with water and have contact angles in excess of 150°. An example of a superhydrophobic material is a nanopost surface. An aqueous liquid sits on the closely-spaced hydrophobic posts by surface tension.

Surfaces can be engineered for cell culture by photolithography and softlithography and using microfluidics to pattern selective functional groups and topologies. These approaches enable the formation of surfaces and structures that influence cell morphogenesis, adhesion, proliferation, apoptosis, and the molecular signaling pathways that govern these behaviors. Cells become aligned and oriented with respect to topological cues, are sensitive to spatial restrictions of the growth area, and are sensitive to the elasticity of the substrate.

The formation of biofilms on replicated nanostructure surfaces can be controlled using passive and active methods. Passive methods involve the use of static nanostructured surfaces, in which the geometry, surface chemistry, or other properties of the nanostructured surface are selected to hinder biofilm growth. Active methods involve the use of mechanical actuation of a nanostructure array to disrupt biofilm growth by hindering biomolecular and cellular adhesion, reducing cellular viability, and slowing down biofilm formation. Any of the actuation methods described above can be used. The nanostructured surfaces used for biofilm control are high-aspect-ratio structures that can be fabricated in a wide range of materials, and are not confined to silicon. Examples include polymeric materials, such as epoxies, polyacrylates and silicone rubbers.

Figure 18:
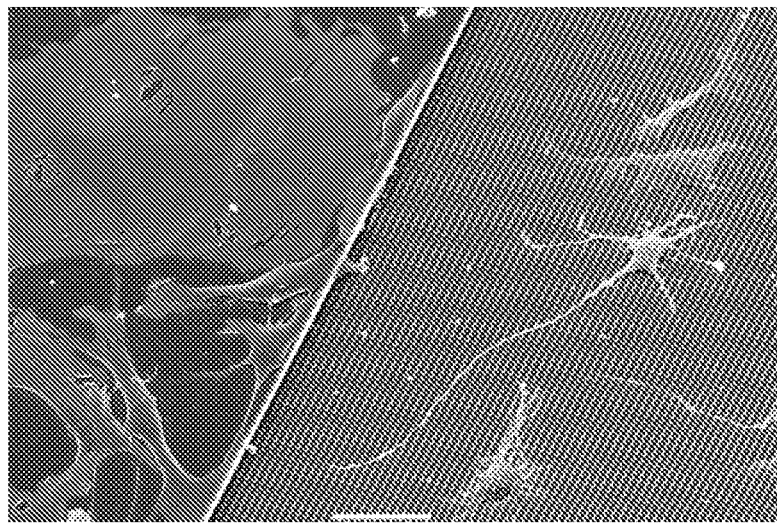
FIG. 18 is an image of growth of murine cells on flat silicon substrate and on a nanopost array.

Certain surface structures can interfere with the normal viability requirements of a cell without any surface actuation. Nanostructured silicon substrates with an array of high-aspect-ratio nanostructured posts can significantly reduce the extent of cell adhesion and spreading compared to their behavior on a flat silicon surface. FIG. 18 is an image showing the differences in the overnight growth of murine cells on a Si substrate, spreading on a flat (unetched) region (left side), and growing in a constrained manner with long, narrow extensions on the region that has an array of 300 nm diameter posts (8 μm tall, 3 μm spacing), on the right side.

Active methods of preventing the formation of biofilms involve mechanical actuation of the nanostructured surface that causes the cells to respond by complex interactions with the physical and chemical properties of the substrate. Hybrid structures shown in FIG. 1D that have stiff nanoposts and a soft, extendable backing can be mechanically actuated by a periodic extension of the backing that results in changes in spacings and orientation of the nanoposts, thus retarding and often fully preventing the adhesion of bacterial cells and their growth into biofilms. Due to a soft attachment points, such nanoposts can also be easily movable in a liquid flow and thus reduce the biofilm growth by flow actuation. The control of the attachment, motility and viability of cells on mechanically-actuated, polymer-infiltrated nanopost array surfaces are demonstrated.

Figure 19:
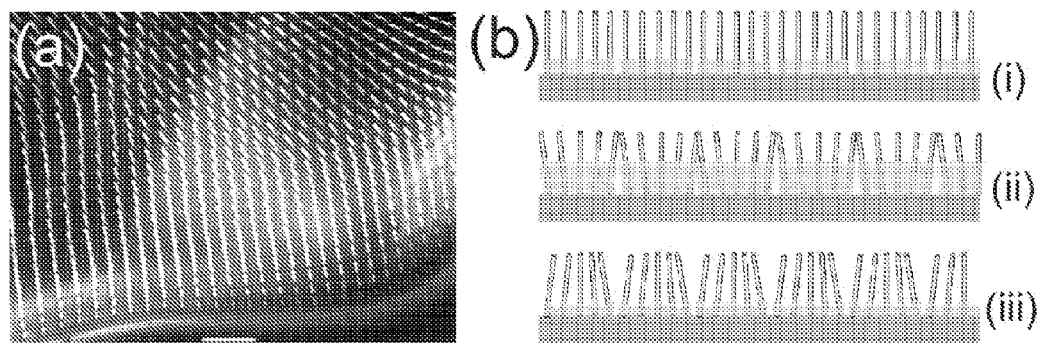
FIG. 19 illustrates a hybrid nanostructured surface composed of a hydrogel polymer film with embedded, free-standing silicon nanoposts, which can be mechanically-actuated and put in motion by the polymer (a). A schematic of how an infiltrated polymer film, patterned into discrete regions, can cause local deformations of a nanopost array, from the normal (i), to the swollen (ii), and contracted (iii) states (b).

FIG. 19A show a mechanically-actuated silicon nanopost array that uses an infiltrated hydrogel layer. The mechanical actuation of the posts implemented by the polymer layer may be controlled by stimuli such as pH, temperature or electrical charge. These stimuli can cause abrupt or periodic movement of the posts, either uniformly across the nanopost array, or as localized movement caused by patterned regions of the polymer layer, as illustrated in FIG. 19B. This actuation interferes with the adhesion and growth of cells or spreading of the film. Thus in addition to influencing cell attachment, motility and viability through structure and chemical functionality (i.e., the passive effects described above), these mechanically-actuated surface structures also mechanically disrupt the ability of cells to behave normally and interact with each other and their environment.

In various embodiments, the structure is a periodic or non-periodic array of posts, with a defined range of aspect ratios, which is not necessarily material-specific. The mechanically-actuated infiltrated layer is not material-specific (though is most likely a polymer, such as a hydrogel material), and could be a continuous layer, or patterned into discrete regions. The surface chemistry of the posts could be modified, for example to be made hydrophobic or functionalized. The scale of the post structures involves posts having diameters less than about 1 µm diameter, heights of about 1-10 µm, and pitch spacings of about 0.5-10 µm. The posts can be free-standing or attached to the substrate. The surfaces can be wetting or non-wetting. For example, polyacrylamide gel at medium humidity levels (as shown in (i) will have an intermediate volume between the fully extended state upon exposure to water or increase in humidity (as shown in (ii)) and between the contracted dry state (iii). These changes induce rearrangements and movements of the features.

There are a number of important biomaterial and bioMEMs applications known as biofouling prevention that make use of resistance of protein adsorption and cell adhesion during in vivo operation. Examples include biomedical sensors, arterial stents, drug delivery systems and neural electrode implants. In the described embodiment, nanopost array surface structures are used to influence and prevent the attachment, motility and viability of cells through structural and chemical engineering of these structures to interfere with normal cellular behavior. The use of mechanically-actuated nanopost array surface structures also provides additional interference for the attachment, motility and viability of cells. These effects can be used to control and prevent the formation of biofilms, and the biofouling of surfaces.

There are two main areas in which such devices would be suitable for the prevention of biofilms: 1. hospital walls and 2. intervenes and interarterial catheters. In the first application one could coat the walls of a hospital with nanopost surfaces (mainly polymeric material such as epoxy) and actuating the posts by different stimuli as described above. In the second application one would utilize the fluctuation flow rates in blood vessels to actuate the posts back and forth. Rigid nanoposts in a flexible backing may be particularly suitable for this application. See, e.g., FIG. 1D. This is especially useful on stents for example.

Fluid Applications; Flow or Drag Reduction

Another example of the application of these nanoarrays is in flow sensors. In a flow sensor, the actuation/deflection of structures provide the measure of the force and flow. If the structures are chemically treated to be superhydrophobic, only the tips of the posts will sense the flow. However if alternatively the whole structure is hydrophilic, then the force of the flow will act on the entire post. In one or more embodiments the posts have elliptical cross sections, so that the posts respond differently to flows in different directions. The demonstrated unique capability to create nanostructures with elliptical cross-sections makes it possible to design a truly biomimetic sensor that responds to an anisotropic flow field in a manner, similar to cilia in fish and amphibians. In this case, the moment of inertia in the directions of the two radii will be: $I_1=\pi r_1^3 r_2/4$ and $I_2=\pi r_1 r_2^3/4$, and for the given force, the deflection in the direction of $r_1$ compared to $r_2$ scales as $(r_2/r_1)^2$.

Figure 22:
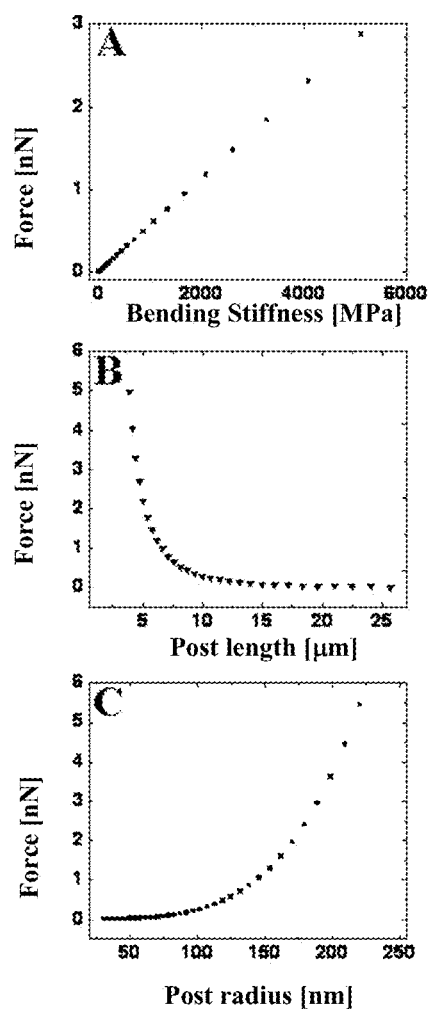
FIG. 22 is a plot of force vs. post length to illustrate the mechanical characteristics of the structures demonstrating the force applied at the tip of a post needed to bend the post to a given deflection, $Y_{tz}$=0.5 μm as a function of A) post bending modulus [l=8 μm, r=125 nm]; B) post length [r=125 nm, and E=1 GPa]; and C) post radius [l=8 μm, E=1 GPa].

To increase the sensitivity of the nanopost array, the radius of the nanoposts can be reduced (which scales as a power of four), the length of the nanoposts can be increased (scales as a power of three), and the modulus of the nanoposts can be decreased (linear dependence). Graphs that demonstrates the force needed to bend the posts as a function of different parameters is shown in FIGS. 22A-22C, which show the mechanical characteristics of the structures demonstrating the force applied at the tip of a post needed to bend the post to a given deflection, $Y_{lz}=0.5$ µm as a function of A) post bending modulus [l=8 µm, r=125 nm]; B) post length [r=125 nm, and E=1 GPa]; and C) post radius [l=8 µm, E=1 GPa]. As different geometrical and mechanical parameters all have an effect on the force needed to actuate the posts, it is very helpful to introduce a unified "effective stiffness" parameter, $S_{effect}$, to compare the different cases. This parameter could be defined as the force per unit deflection of the posts: $S_{effect}=F/Y_{lz}$. In order to compare two structures, the ratio of the two $S_{effect}$ as calculated. For a circular cross-section:

$$\frac{S_{1effect}}{S_{2effect}} = \left(\frac{E_1}{E_2}\right)\left(\frac{l_2}{l_1}\right)^3 \left(\frac{r_1}{r_2}\right)^4 \tag{2}$$

This dimensionless parameter allows the direct and simple comparison of the actuation capabilities of the nanostructures.

Figure 20:
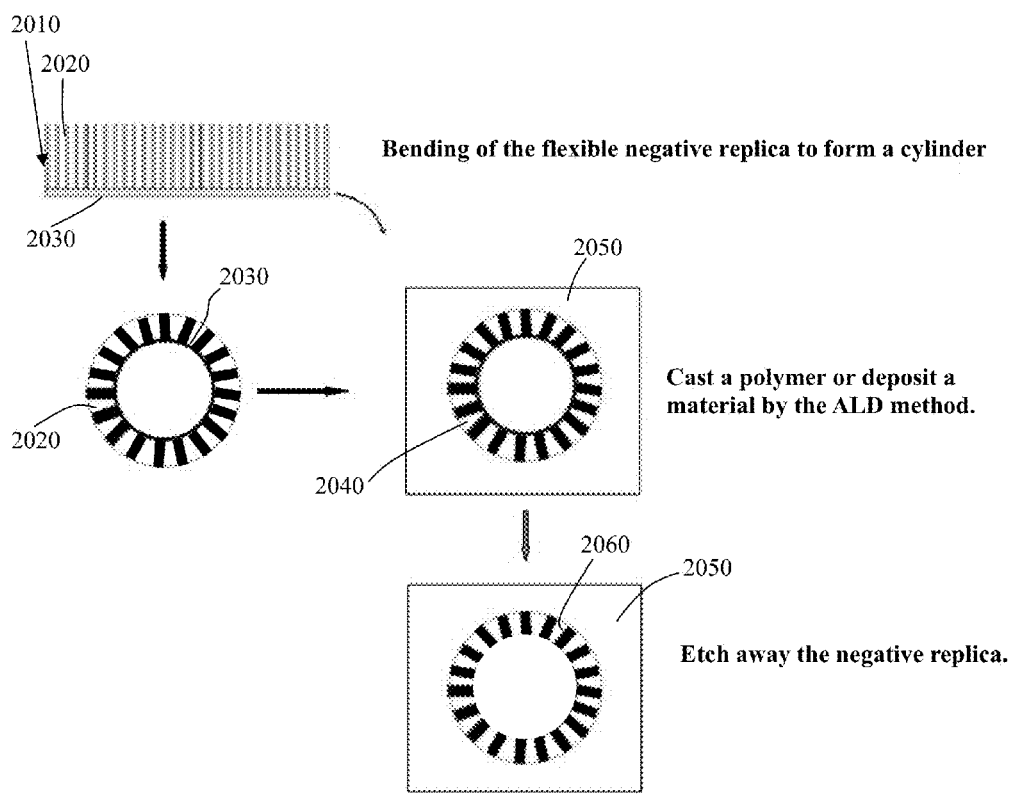
FIG. 20 is schematic illustration of a low-drag pipe.

Flow conduits, such as pipes or parts of pipes, having nanopost arrays on their inner periphery can be formed from flexible negative replicas that can be bent into cylinders. Combining this with the super-hydrophobic character of the posts results in pipes that have much-reduced drag. FIG. 20 illustrates a formation of a low-drag pipe. Negative replica 2010, having a base 2030 and an array of recesses 2020 is bent into a cylindrical shape with base 2030 defining the cylinder and recesses 2020 forming the outer surface of the cylindrical mold. The mold is filled, for example, by casting a polymer or depositing material by vapor deposition. The cast material 2040 occupies the recesses 2020 and forms a backing 2050 to support the nanoposts 2060.

Alternatively, pipes can be formed from negative replicas that have undergone shearing so as to form posts that tilt in one of the flow directions. In this case one can reduce the flow against the direction of the tilt of the posts while not hindering the flow in the direction of the tilt of the posts. Asymmetrical arrays of nanoposts with directionally tilted posts can be used to make surfaces having a higher friction in the direction opposite to the direction of tilt of the posts. This can be used in systems that transport the particles in which one wants to prevent the reverse motion of the particles. It could also be incorporated into the flow or drag reduction pipes described herein.

Surfaces can also be designed to switch between wetting and nonwetting properties. Nanoposts in the upright position have super-hydrophobic characteristics. Tilting the posts increases the surface wettability. The increased wettability is reversed by moving the posts back into an upright position. The effect is enhanced by selectively depositing materials on the sides of the posts that have desired wettability attributes.

Adhesive Glue

Figure 21:
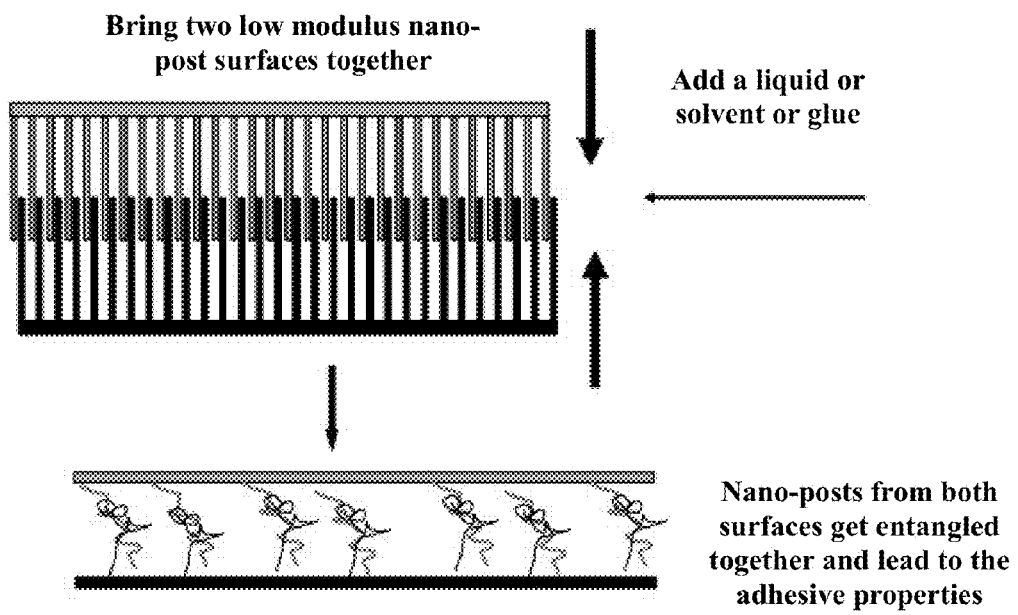
FIG. 21 is a schematic illustration of using nanopost arrays as adhesive surfaces or for particle trapping.

By applying a wetting liquid to low modulus-polymeric-replicated surfaces which have their nanoposts facing each other, the nanoposts cluster together, twist, and interlock. This property can be used as a superior adhesive. An alternative way to form an adhesive is to use one surface of the replicated nanoposts against any kind of fabric that has micrometer-size strands or strings. This adhesive combines chemical bonding with nanometer-scale mechanical bonding, which can make it stronger and more durable than conventional adhesives that only use chemical bonding. In these adhesives, chemical bonding is achieved by using a solvent that dissolves a small amount of the polymer and then cures once the posts are twisted together. The mechanical bonding is achieved by the twisting and entanglement of the nanoposts with their neighboring posts. FIG. 21 illustrates the use of the nanoposts as an adhesive. Such mechanical interlocking can be also used for trapping of particles and fibers.

Experimental

An array of silicon nanoposts was fabricated using the Bosch process. The silicon nanopost arrays were treated with an anti-sticking agent (tridecafluoro-1,1,2,2-tetrahydrooctyl)-trichlorosilane (Gelest Inc.) by exposure in a desiccator under vacuum overnight.

Negative replicas were produced from DOW-SYLGARD 184™ (polydimethylsiloxane (PDMS) with a prepolymer-to-curing agent ratio of 10:1. After extensive mixing of the prepolymer and curing agent, the mixture was poured on the silicon nanopost substrate and placed in a vacuum desiccator for one hour to eliminate all air bubbles. It was then thermally cured in an oven for 3 hours at 70° C. After cooling, the negative PDMS mold was gently peeled off the substrate. The negative PDMS mold was then cleaned extensively with ethanol, isopropanol, and acetone sequentially, dried and treated in nitrogen plasma for 1 min in a Femto Diener® plasma cleaner. After this surface treatment, the negative mold was placed in (tridecafluoro-1,1,2,2-tetrahydrooctyl)-trichlorosilane environment in a desiccator under vacuum overnight.

In order to produce the final replica of the master the desired material in liquid form was poured into the negative replica wells. The material completely filled the negative replica and solidified inside it. In order to prevent the formation of bubbles trapped between the mold material and the original structure, a vacuum was applied over the liquid. Once the material solidified, the negative replica was simply peeled off, leaving behind the free-standing nanostructured material. Using this method one can form replicated nanostructures from a variety of materials such as: polymers (e.g. epoxy, PP, PE, PVA, PMMA, PDMS, various hydrogel and shape memory polymers) and metals and alloys which have a low melting point (e.g. Ga, InBi and Woods alloy). An exemplary nanostructured replica was made from a commercial UV-initiated one-part epoxy UVO-114™ (Epoxy Technology). This epoxy was chosen due to the ease of use and a relatively high bending stiffness of about 1 GPa.

For the experiments involving the control of the flexural modulus of the nanostructures, two liquid epoxy resins—Dow D.E.R. 331™, a liquid reaction product of epichlorohydrin and bisphenol A, and Dow D.E.R. 732™, a viscosity-reducing reaction product of epichlorohydrin and polypropylene glycol—were mixed in different proportions. The mixtures were based on 10% increments of components by weight, from 10% to 100%. In all compositions, UV cross-linking initiator Cyracure UVI 6976™ (Dow) was added to the mixture in a constant 5 weight % amount.

To produce 4-point flexure test epoxy samples, 10×8×62 mm custom aluminum blocks were placed in a glass bowl; PDMS was poured and cured as described above to create molds. Each of the eleven epoxy mixtures as well as the commercial UV-initiated one-part epoxy EPO-TEK UV0-114™ (Epoxy Technology) were sequentially pipetted into the PDMS molds flush with the tops of the wells. Each flexure sample was cured by placing molds directly under a B-100 ultraviolet lamp (UVP BLAK-RAY™) inside a photochemical cabinet until fully cured, which required from 20 minutes to several hours depending on the composition. Mixtures with higher percentage of D.E.R.™ 331™ (stiff liquid epoxy resin) required more time to crosslink.

A custom-built mechanical test system was used to test the epoxy samples in 4-point bending and determine their flexural modulus. The system had a displacement resolution of 10 nm, controlled by a precise step motor with 100 N capacity, and a load resolution of 0.01 N. It was set up on a pneumatic table to shield against vibration and was operated by a PC through LABVIEW™ (Laboratory Virtual Instrument Engineering Workbench). The fixture's upper anvil pins were set at 28 mm apart and lower pins were spaced at 56 mm. A displacement rate of 500 μm/s and a maximum deflection of 3 mm was used for compliant samples, decreasing to 0.5-1.5 mm deflection for stiffer samples, as dictated by the step motor maximum load. The load-deflection data were plotted into linear elastic curves whose slopes were calculated and, along with the anvil and sample geometries, were used in the 4-point bending equation to obtain the flexural moduli of the epoxy replicas.

Imaging of the nanostructures was done by a Zeiss field emission Ultra55 SEM. Chemical analysis was carried out on the SEM using Energy Dispersive Spectroscopy (EDS).

What is claimed is:

1. A method of forming a nanostructured surface, the method comprising:
    providing a negative replica mold of an original nanostructured surface having a plurality of high aspect ratio nanostructures, wherein the negative replica mold is comprised of a deformable material;
    deforming the negative replica mold;
    depositing a material into the negative replica mold to form a deformed replica of the original nanostructured surface, wherein said depositing takes place in a separate step from said deforming; and
    removing the deformed replica from the negative replica mold;
    wherein deforming the negative replica mold comprises subjecting the negative replica mold to one or more deformations selected from the group consisting of compressive deformation in the xy direction, tension, bending, torsional twisting and shear.

2. The method of claim 1, wherein the aspect ratio ranges from about 3 to about 100.

3. The method of claim 1, wherein the plurality of high aspect ratio structures form an array.

4. The method of claim 1, wherein the nanostructures have a width of about 10 nm to about 5 μm; a length of about 1 μm to about 1 cm and a pitch of more than about 100 nM.

5. The method of claim 1, wherein the nanostructures have a width of about 100 nm to about 1 μm; a length of about 1 μm to about 500 μm and a pitch of more than about 100 nM.

6. The method of claim 1, wherein the deformation is a tensile deformation in the x, y or xy direction.

7. The method of claim 1, wherein the deformation is selected to alter the distance between nanostructures.

8. The method of claim 7, wherein the distance between nanostructures is altered by a factor of about 1/3 to about 3.

9. The method of claim 1, wherein the deformation is selected to introduce a tilt angle into the nanostructures with respect to the surface.

10. The method of claim 9, wherein the deformation introduces a tilt angle in the range of greater than 0° to about 65°.

11. The method of claim 1, wherein the deformation is selected to reduce the aspect ratio of the nanostructure.

12. The method of claim 11, wherein the nanostructure aspect ratio is reduced by a factor of up to 1/3.

13. The method of claim 1, wherein the deformation is a tensile or compressive deformation in the xy direction.

14. The method of claim 13, wherein the deformed nanostructures form a rhombus or parallelogram arrangement.

15. The method of claim 1, wherein the deformation comprises an angular shear deformation applied to an upper or lower surface of the negative mold.

16. The method of claim 1, wherein the deformation comprises bending the negative replica mold to form a convex or concave surface.

17. The method of claim 1, wherein introducing a material for forming the deformed replica into the negative replica mold comprises:

introducing a first material into the negative replica mold;
introducing a second material into the negative replica mold and on top of the first material, wherein the deformed replica comprises a first material layer formed from the first material and a second material layer formed from the second material, wherein the high aspect ratio structures of the deformed replica are formed predominantly by the first layer material.

18. The method of claim 17, wherein the first and the second material layers of the deformed replica have different stiffness values.

19. The method of claim 1, wherein the negative replica mold of an original nanostructured surface comprises:

a plurality of original negative replica molds, said plurality of negative replica molds having the same or different original nanostructured surfaces,
wherein the plurality of original negative replica molds are arranged to form composite negative replica molds.

20. The method of claim 19, wherein the composite negative replica mold defines a curved surface.

21. The method of claim 1, wherein the material for forming the deformed replica is introduced by atomic layer deposition (ALD) or chemical vapor deposition.

22. The method of claim 1, further comprising:

depositing a layer of an actuator material on the surface of the replica, wherein the actuator material contacts a plurality of the high aspect ratio structures at the base region, and wherein actuating the actuator material causes the actuator material to exert a force on the plurality of the high aspect ratio structures.

23. The method of claim 1, wherein the compressive deformation in the xy direction comprises deformation in x direction, y direction, or a combination of x and y directions.

* * * * *